US012757535B2

(12) United States Patent
Gee et al.

(10) Patent No.: US 12,757,535 B2
(45) Date of Patent: Oct. 6, 2026

(54) DISPLAY DEVICE INCLUDING LIGHT EMITTING DIODE WITH QUANTUM DOT LAYER ON A STRETCHABLE LOWER SUBSTRATE

(71) Applicant: LG Display Co., Ltd., Seoul (KR)

(72) Inventors: MoonBae Gee, Paju-si (KR); JunHyuk Song, Seoul (KR)

(73) Assignee: LG Display Co., Ltd., Seoul (KR)

( * ) Notice: Subject to any disclaimer, the term of this patent is extended or adjusted under 35 U.S.C. 154(b) by 374 days.

(21) Appl. No.: 18/397,122

(22) Filed: Dec. 27, 2023

(65) Prior Publication Data

US 2024/0222338 A1 Jul. 4, 2024

(30) Foreign Application Priority Data

Dec. 30, 2022 (KR) ........................ 10-2022-0190208

(51) Int. Cl.
*H10H 20/84* (2025.01)
*H10H 20/851* (2025.01)
*H10H 20/856* (2025.01)

(52) U.S. Cl.
CPC ........ *H10H 20/84* (2025.01); *H10H 20/8512* (2025.01); *H10H 20/856* (2025.01)

(58) Field of Classification Search
CPC .. H10H 20/84; H10H 20/8512; H10H 20/856; H10H 20/813; H10K 77/111
See application file for complete search history.

(56) References Cited

U.S. PATENT DOCUMENTS

| | | | | |
|---|---|---|---|---|
| 9,293,091 | B2 | 3/2016 | Lee et al. | |
| 2015/0333102 | A1 | 11/2015 | Sato | |
| 2017/0229429 | A1* | 8/2017 | He | H10W 90/00 |
| 2018/0166643 | A1* | 6/2018 | Kim | H10K 50/115 |
| 2018/0321558 | A1* | 11/2018 | Hu | G02F 1/133603 |
| 2018/0351035 | A1* | 12/2018 | Chung | H10D 86/40 |
| 2019/0214376 | A1 | 7/2019 | Kim | |
| 2020/0274039 | A1* | 8/2020 | Chen | H10H 20/84 |
| 2020/0381474 | A1* | 12/2020 | Choi | H10H 29/142 |
| 2022/0122948 | A1 | 4/2022 | Kim et al. | |
| 2023/0216006 | A1 | 7/2023 | Lee et al. | |
| 2023/0275197 | A1 | 8/2023 | Kim et al. | |

FOREIGN PATENT DOCUMENTS

| | | | |
|---|---|---|---|
| CN | 108257949 | A | 7/2018 |
| CN | 108257979 | A | 7/2018 |
| CN | 111341813 | A | 6/2020 |
| CN | 112614439 | A | 4/2021 |

(Continued)

*Primary Examiner* — Changhyun Yi
(74) *Attorney, Agent, or Firm* — Seed Intellectual Property Law Group LLP

(57) ABSTRACT

According to an aspect of the present disclosure, a display device includes a stretchable lower substrate. The display device includes a plurality of lower plate patterns disposed on the lower substrate. The display device includes a plurality of pixels disposed on the plurality of lower plate patterns. Each of the plurality of pixels includes a plurality of light emitting diodes. The display device includes a quantum dot layer is disposed in at least one of the plurality of light emitting diodes. By doing this, a luminous efficiency and a reliability of the display device may be improved.

20 Claims, 6 Drawing Sheets

(56) References Cited

FOREIGN PATENT DOCUMENTS

| | | | |
|---|---|---|---|
| KR | 102119680 | B1 | 6/2020 |
| KR | 10-2020-0137059 | A | 12/2020 |
| KR | 20210047199 | A | 4/2021 |
| KR | 10-2022-0014470 | A | 2/2022 |
| KR | 10-2022-0049895 | A | 4/2022 |
| KR | 20230103669 | A | 7/2023 |
| TW | 201426152 | A | 7/2014 |

* cited by examiner

DISPLAY DEVICE INCLUDING LIGHT EMITTING DIODE WITH QUANTUM DOT LAYER ON A STRETCHABLE LOWER SUBSTRATE

CROSS-REFERENCE TO RELATED APPLICATIONS

This application claims the priority of Korean Patent Application No. 10-2022-0190208 filed on Dec. 30, 2022, in the Korean Intellectual Property Office, the disclosure of which is incorporated herein by reference.

BACKGROUND

Technical Field

The present disclosure relates to a stretchable display device.

Description of the Related Art

As display devices which are used for a monitor of a computer, a television, or a cellular phone, there are an organic light emitting display (OLED) device which is a self-emitting device and a liquid crystal display (LCD) device which requires a separate light source.

An applicable range of the display device is diversified to personal digital assistants as well as monitors of computers and televisions and a display device with a large display area and a reduced volume and weight is being studied.

Recently, a display device which is manufactured by forming a display unit and a wiring line on a flexible substrate such as plastic which is a flexible material so as to be stretchable in a specific direction and changed in various forms is getting attention as a next generation display device.

BRIEF SUMMARY

Various embodiments of the present disclosure provide a display device which includes a light emitting diode with a quantum dot and is stretchable.

Various embodiments of the present disclosure provide a display device which increases or maximizes a luminous efficiency of a light emitting diode.

The technical benefits of the present disclosure are not limited to the above-mentioned benefits, and other benefits, which are not mentioned above, can be clearly understood by those skilled in the art from the following descriptions.

According to an aspect of the present disclosure, a display device includes a stretchable lower substrate, a plurality of lower plate patterns disposed on the lower substrate, and a plurality of pixels disposed on the plurality of lower plate patterns. Each of the plurality of pixels includes a plurality of light emitting diodes. The display device includes a quantum dot layer disposed in at least one of the plurality of light emitting diodes. By doing this, a luminous efficiency and a reliability of the display device may be improved.

Other detailed matters of the exemplary embodiments are included in the detailed description and the drawings.

According to the present disclosure, in the display device, a stable low potential voltage may be supplied to the light emitting diode to ensure the luminous efficiency and the stability of the light emitting diode.

According to the present disclosure, a reliability of a quantum dot layer is improved thereby enhancing the reliability of implementing an image of the display device.

According to the present disclosure, the display device reduces or minimizes the light loss to increase a color purity and a luminous efficiency and be driven with a low power.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
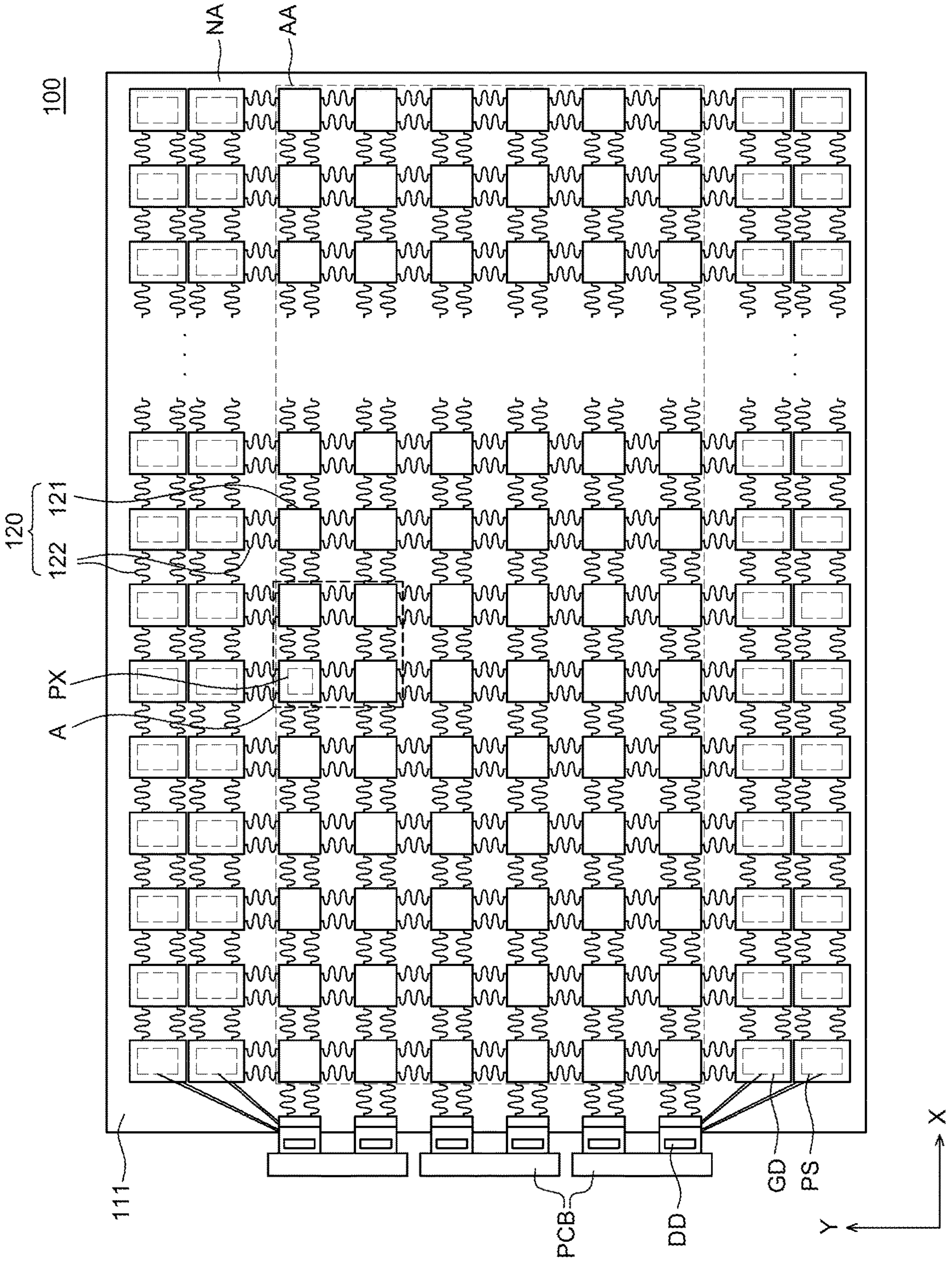
FIG. 1 is a plan view illustrating a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, dimensions (e.g., length, width, height, thickness, radius, diameter, area, etc.), ratios, angles, numbers, and the like illustrated in the accompanying drawings for describing the exemplary embodiments of the present disclosure are merely examples, and the present disclosure is not limited thereto.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term “only”. Any references to singular may include plural unless expressly stated otherwise.

Components are interpreted to include an ordinary error range even if not expressly stated.

When the position relation between two parts is described using the terms such as “on”, “above”, “below”, and “next”, one or more parts may be positioned between the two parts unless the terms are used with the term “immediately” or “directly”.

When an element or layer is disposed “on” another element or layer, the element or layer may be directly disposed on another element or layer, or other element or layer may be interposed therebetween.

Although the terms “first”, “second”, and the like are used for describing various components, these components are not confined by these terms. These terms are merely used for distinguishing one component from the other components. Therefore, a first component to be mentioned below may be a second component in a technical concept of the present disclosure.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

A display device according to an exemplary embodiment of the present disclosure is a display device which is capable of displaying images even in a bent or extended state and may also be referred to as a stretchable display device, a flexible display device and an extendable display device. As compared with the general display devices of the related art, the display device has not only a high flexibility, but also stretchability. Therefore, the user may bend or extend a display device and a shape of a display device may be freely changed in accordance with manipulation of a user. For example, when the user pulls the display device by holding ends of the display device, the display device may be extended to the pulling direction of the user. Alternatively, when the user disposes the display device on an outer surface which is not flat, the display device may be disposed to be bent in accordance with the shape of the outer surface of the wall. Further, when a force applied by the user is removed, the display device may return to its original shape.

Stretchable Substrate and Pattern Layer

FIG. 1 is a plan view illustrating a display device according to an exemplary embodiment of the present disclosure.

Figure 2:
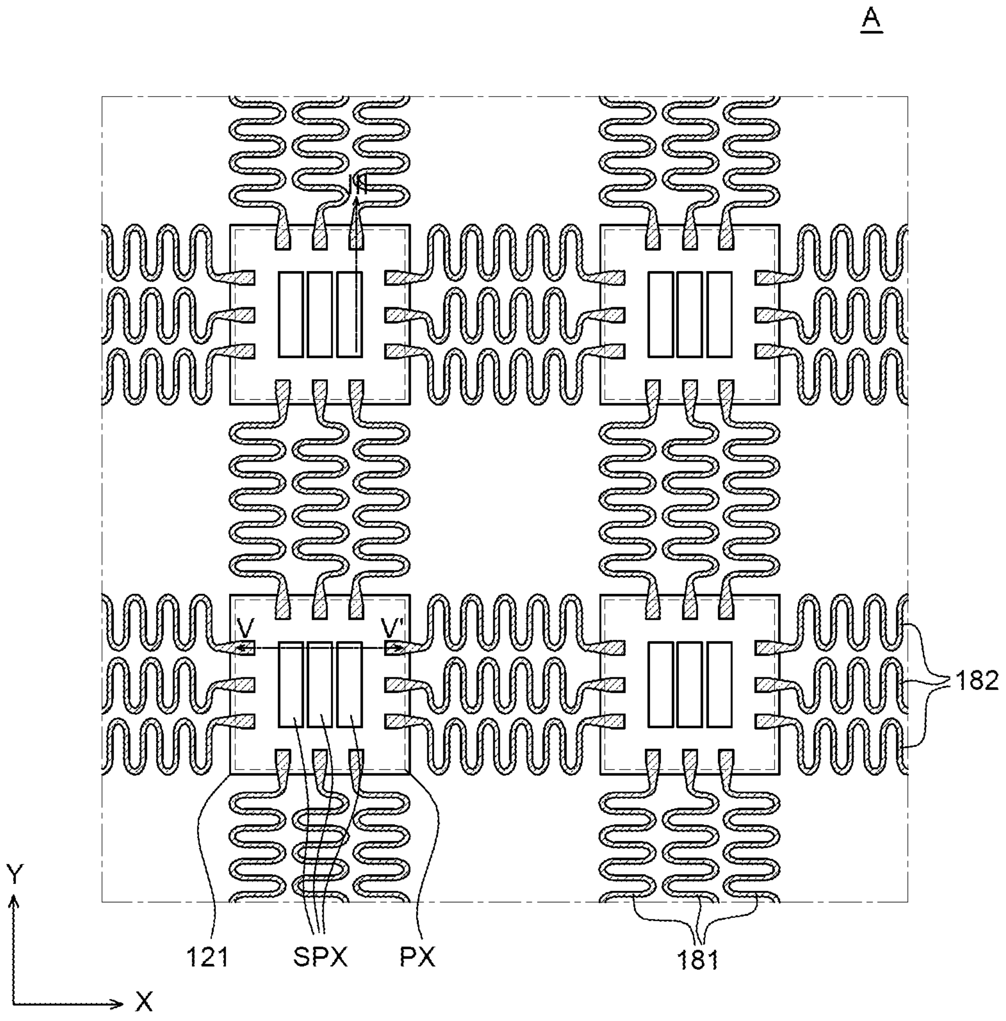
FIG. 2 is an enlarged plan view of a lower substrate of a display device according to an exemplary embodiment of the present disclosure.

FIG. 2 is an enlarged plan view of a lower substrate of a display device according to an exemplary embodiment of the present disclosure.

Figure 3:
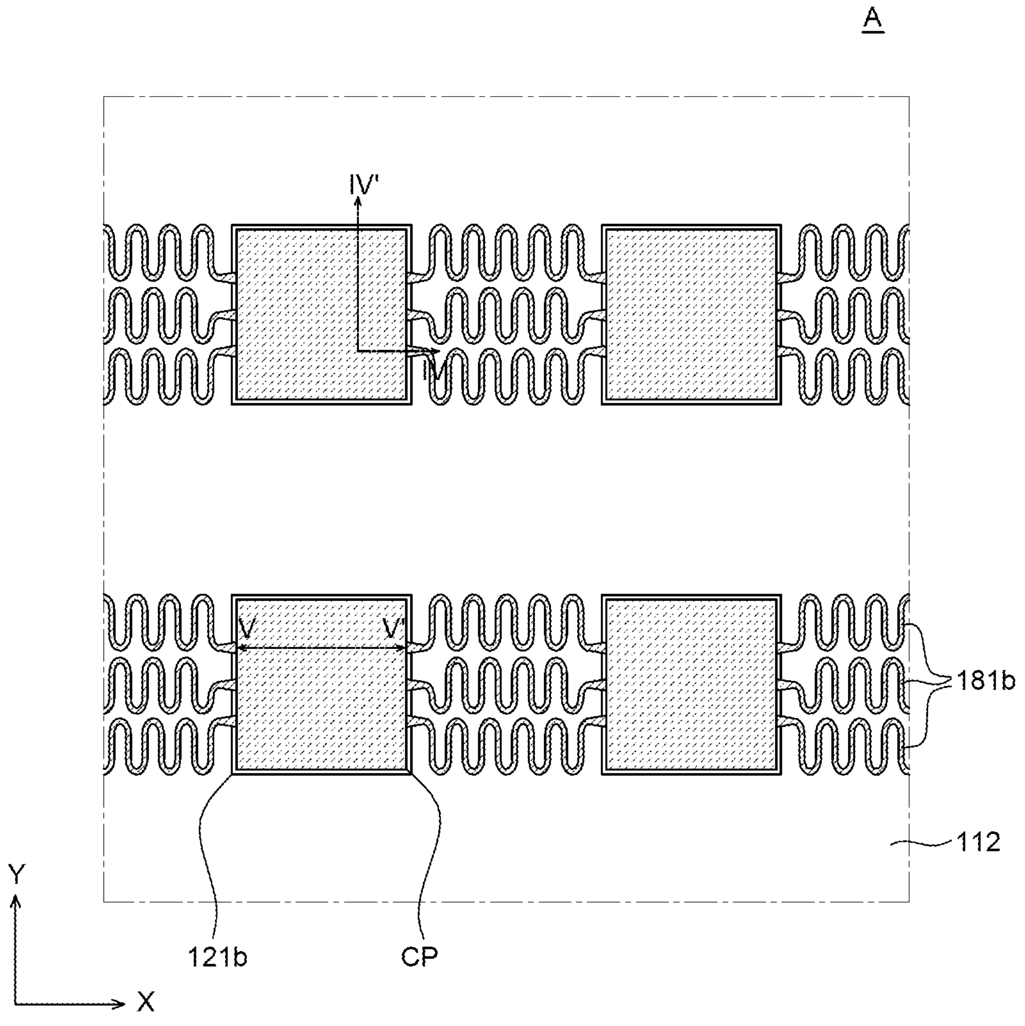
FIG. 3 is an enlarged plan view of an upper substrate of a display device according to an exemplary embodiment of the present disclosure.

FIG. 3 is an enlarged plan view of an upper substrate of a display device according to an exemplary embodiment of the present disclosure.

Figure 4:
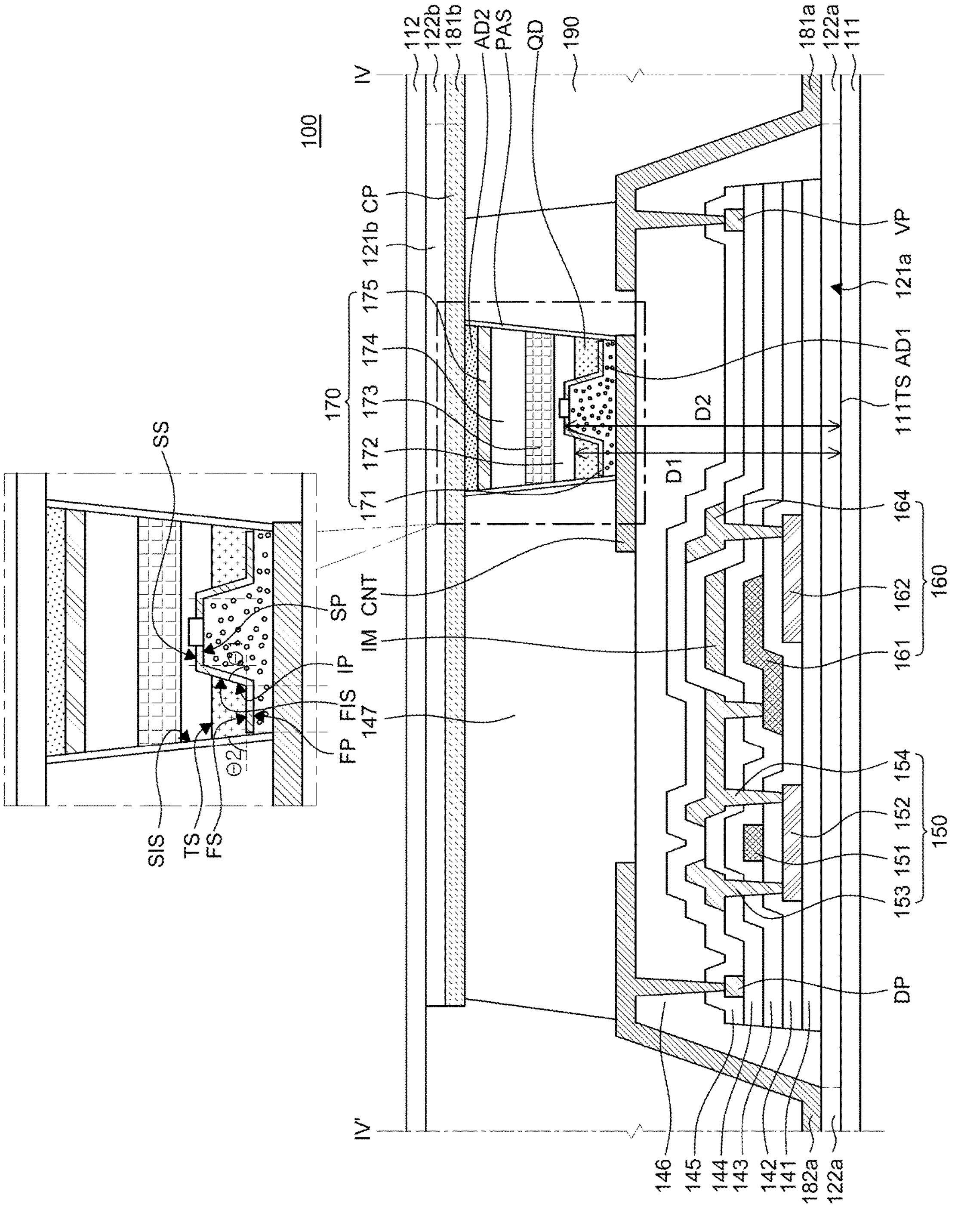
FIG. 4 is a cross-sectional view taken along the line IV-IV' of FIGS. 2 and 3.

FIG. 4 is a cross-sectional view taken along the line IV-IV' of FIGS. 2 and 3.

For the convenience of description, FIG. 1 illustrates components other than the upper substrate 112. Further, in FIG. 2, a lower substrate 111 and components disposed on the lower substrate 111 in an area A illustrated in FIG. 1 are illustrated. Further, in FIG. 3, an upper substrate 112 and components disposed on the upper substrate 112 in an area A illustrated in FIG. 1 are illustrated.

Referring to FIG. 1, a display device 100 according to an exemplary embodiment of the present disclosure may include a lower substrate 111, a pattern layer 120, a plurality of pixels PX, a gate driver GD, a data driver DD, and a power supply PS. In the exemplary embodiment, further referring to FIGS. 3 and 4, the display device 100 may further include a filling layer 190 and an upper substrate 112.

The lower substrate 111 is a substrate which supports and protects several components of the display device 100. The upper substrate 112 is a substrate which covers and protects several components of the display device 100. That is, the lower substrate 111 is a substrate which supports the pattern layer 120 on which the pixels PX, the gate driver GD, and the power supply PS are formed. The upper substrate 112 is a substrate which covers the pixels PX, the gate driver GD, and the power supply PS.

The lower substrate 111 and the upper substrate 112 which are flexible substrates, respectively, may be configured by an insulating material which is bendable or extendable. For example, the lower substrate 111 and the upper substrate 112 may be formed of a silicon rubber such as polydimethylsiloxane (PDMS) or an elastomer such as polyurethane (PU) or polytetrafluoroethylene (PTFE). Accordingly, the lower substrate 111 and the upper substrate 112 may have flexibility. Depending on the exemplary embodiment, the materials of the lower substrate 111 and the upper substrate 112 may be the same, but are not limited thereto and may vary.

The lower substrate 111 and the upper substrate 112 are ductile substrates so as to be reversibly expandable and contractible. Accordingly, the lower substrate 111 may also be referred to as a lower stretchable substrate, a lower stretching substrate, a lower extending substrate, a lower ductile substrate, a lower flexible substrate, a first stretchable substrate, a first stretching substrate, a first extending substrate, a first ductile substrate, or a first flexible substrate. The upper substrate 112 may also be referred to as an upper stretchable substrate, an upper stretching substrate, an upper extending substrate, an upper ductile substrate, an upper flexible substrate, a second stretchable substrate, a second stretching substrate, a second extending substrate, a second ductile substrate, or a second flexible substrate. Further, moduli of elasticity of the lower substrate 111 and the upper substrate 112 may be several MPa to several hundreds of MPa. Further, a ductile breaking rate of the lower substrate 111 and the upper substrate 112 may be 100% or higher. Here, the ductile breaking rate refers to a stretching rate at a timing when an object to be stretched is broken or cracked. A thickness of the lower substrate 111 may be 10 um to 1 mm, but is not limited thereto.

The lower substrate 111 may include an active area AA and a non-active area NA which encloses the active area AA. However, the active area AA and the non-active area NA are not mentioned to be limited to the lower substrate 111, but mentioned for the entire display device 100.

The active area AA may be an area in which images are displayed in the display device 100. A plurality of pixels PX may be disposed on the active area AA. Each pixel PX may include a display element and various driving elements for driving the display element. Various driving elements may refer to at least one thin film transistor (TFT) and a capacitor, but are not limited thereto. The plurality of pixels PX may be connected to various wiring lines, respectively. For example, each of the plurality of pixels PX may be connected to various wiring lines, such as a gate line, a data line, a high potential voltage line, a low potential voltage line, a reference voltage line, and an initialization voltage line.

The non-active area NA may be an area where no image is displayed. The non-active area NA may be disposed to be adjacent to the active area AA. For example, the non-active area NA may be an area which encloses the active area AA. However, it is not limited thereto so that the non-active area NA corresponds to an area excluding the active area AA from the lower substrate 111 and may be modified and separated in various forms. Components for driving a plurality of pixels PX disposed in the active area AA may be disposed on the non-active area NA. That is, the gate driver GD and the power supply PS may be disposed on the non-active area NA. Further, on the non-active area NA, a plurality of pads connected to the gate driver GD and the data driver DD may be disposed and each pad may be connected to each of the plurality of pixels PX of the active area AA.

The pattern layer 120 may be disposed between the lower substrate 111 and the upper substrate 112. Specifically, as illustrated in FIG. 4, the pattern layer 120 may include lower pattern layers 121*a* and 122*a* and upper pattern layers 121*b* and 122*b*. The lower pattern layers 121*a* and 122*a* are pattern layers which are disposed on the lower substrate 111 to be in contact with the lower substrate 111. The upper pattern layers 121*b* and 122*b* are pattern layers which are disposed on the upper substrate 122 to be in contact with the upper substrate 112.

Referring to FIG. 1, the pattern layer 120 may include a plurality of plate patterns 121*a* and 121*b* which is disposed as islands which are spaced apart from each other and a plurality of line patterns 122*a* and 122*b* which connects the plurality of plate patterns.

Specifically, as illustrated in FIG. 2, the lower pattern layers 121*a* and 122*a* may include a plurality of lower plate patterns 121*a* which is disposed as islands which are spaced apart from each other and a plurality of lower line patterns 122*a* which connects the plurality of lower plate patterns 121*a*. As illustrated in FIG. 3, the upper pattern layers 121*b* and 122*b* may include a plurality of upper plate patterns 121*b* which is disposed as islands which are spaced apart from each other and a plurality of upper line patterns 122*b* which connects the plurality of upper plate patterns 121*b*.

Referring to FIGS. 1, 2, and 4, a plurality of pixels PX may be formed on the plurality of lower plate patterns 121*a* disposed in the active area AA. Further, the gate driver GD and the power supply PS may be disposed on the plurality of lower plate patterns 121*a* disposed in the non-active area NA.

In other words, the plurality of pixels PX may be formed below the plurality of upper plate patterns 121*b* disposed in the active area AA. Further, the gate driver GD and the power supply PS may be formed below the upper pattern layers 121*b* and 122*b* disposed in the non-active area NA.

The plurality of upper plate patterns 121*b* and the plurality of lower plate patterns 121*a* may be individually separated, respectively. Accordingly, the plurality of upper plate patterns 121*b* may also be referred to as a plurality of upper island patterns or upper individual patterns. The plurality of lower plate patterns 121*a* may also be referred to as a plurality of lower island patterns or lower individual patterns.

In one exemplary embodiment, the gate driver GD may be mounted on the plurality of lower plate patterns 121*a* disposed in the non-active area NA. Various circuit configurations which configure the gate driver GD, such as various transistors, capacitors, and wiring lines, may be disposed on the plurality of lower plate patterns 121*a* disposed in the non-active area NA. However, this is illustrative, so that the exemplary embodiment of the present disclosure is not limited thereto and the gate driver GD may be mounted on the plurality of lower plate patterns 121*a* disposed in the non-active area NA in a chip on film (COF) manner.

In one exemplary embodiment, the power supply PS may be mounted on the plurality of lower plate patterns 121*a* disposed in the non-active area NA. Power blocks which are disposed on different layers from each other may be disposed on the plurality of lower plate patterns 121*a* disposed in the non-active area NA. A lower power block and an upper power block may be sequentially disposed on the plurality of lower plate patterns 121*a* disposed in the non-active area NA. For example, a low potential voltage may be applied to the lower power block and a high potential voltage may be applied to the upper power block. Accordingly, a low potential voltage may be supplied to the plurality of pixels PX through a lower power block and a high potential voltage may be supplied to the plurality of pixels through an upper power block.

According to the exemplary embodiment, as illustrated in FIG. 1, sizes of the plurality of lower plate patterns 121*a* disposed in the non-active area NA may be larger than sizes of the plurality of lower plate patterns 121*a* disposed in the active area AA. To be more specific, an area occupied by various circuit configurations which configure one stage of the gate driver GD is relatively larger than an area occupied by the pixels PX. Therefore, a size of the plurality of lower plate patterns 121*a* disposed in the non-active area NA may be larger than a size of the plurality of lower plate patterns 121*a* disposed in the active area AA.

Even though in FIG. 1, it is illustrated that the plurality of lower plate patterns 121*a* disposed in the non-active area NA is disposed on both sides of a second direction Y in the non-active area NA, this is illustrative, but the exemplary embodiment of the present disclosure is not limited thereto. For example, the plurality of lower plate patterns 121*a* disposed in the non-active area NA may be disposed in an arbitrary area of the non-active area NA. Further, even though in FIGS. 1 and 2, the plurality of lower plate patterns 121*a* has a square shape, this is illustrative and the exemplary embodiment of the present disclosure is not limited thereto and the plurality of lower plate patterns 121*a* may be modified in various forms.

In the meantime, the plurality of lower line patterns 122*a* is patterns which connect adjacent lower plate patterns 121*a* and may be referred to as lower connection patterns. That is, the plurality of lower line patterns 122*a* may be disposed between the plurality of lower plate patterns 121*a*.

The plurality of upper line patterns 122*b* is patterns which connect adjacent upper plate patterns 121*b* and may be referred to as upper connection patterns. That is, the plurality of upper line patterns 122*b* may be disposed between the plurality of upper plate patterns 121*b*.

In one exemplary embodiment, referring to FIG. 1, each of the plurality of upper line patterns 122*b* and the plurality of lower line patterns 122*a* may have a wavy shape. For example, each of the plurality of upper line patterns 122*b* and the plurality of lower line patterns 122*a* may have a sinusoidal shape. However, this is just illustrative and the shapes of the plurality of upper line patterns 122*b* and the plurality of lower line patterns 122*a* are not limited thereto. For example, the plurality of upper line patterns 122*b* and the plurality of lower line patterns 122*a* may have a zigzag shape. As another example, the plurality of upper line patterns 122*b* and the plurality of lower line patterns 122*a* may have various shapes such as a plurality of rhombic shapes which is connected at their vertexes to be extended. As described above, a number and a shape of each of the plurality of upper line patterns 122*b* and the plurality of lower line patterns 122*a* illustrated in FIG. 1 are illustrative and the number and the shape of each of the plurality of upper line patterns 122*b* and the plurality of lower line patterns 122*a* may vary depending on the design.

In one exemplary embodiment, each of the plurality of upper plate patterns 121*b*, the plurality of lower plate patterns 121*a*, the plurality of upper line patterns 122*b*, and the plurality of lower line patterns 122*a* may be rigid patterns. For example, each of the plurality of upper plate patterns 121*b*, the plurality of lower plate patterns 121*a*, the plurality of upper line patterns 122*b*, and the plurality of lower line patterns 122*a* may be more rigid than the lower substrate 111 and the upper substrate 112. Accordingly, the modulus of elasticity of each of the plurality of upper plate patterns 121*b*, the plurality of lower plate patterns 121*a*, the plurality of upper line patterns 122*b*, and the plurality of lower line patterns 122*a* may be higher than the moduli of elasticity of the lower substrate 111 and the upper substrate 112. The modulus of elasticity is a parameter representing a rate of deformation against the stress applied to the substrate and the higher the modulus of elasticity, the higher the hardness. The modulus of elasticity of each of the plurality of upper plate patterns 121*b*, the plurality of lower plate patterns 121*a*, the plurality of upper line patterns 122*b*, and the plurality of lower line patterns 122*a* may be 1000 times higher than the moduli of elasticity of the lower substrate 111 and the upper substrate 112. However, this is illustrative and the exemplary embodiment of the present disclosure is not limited thereto.

In one exemplary embodiment, each of the plurality of upper plate patterns 121*b*, the plurality of lower plate patterns 121*a*, the plurality of upper line patterns 122*b*, and the plurality of lower line patterns 122*a* may include a plastic material having a lower flexibility than the lower substrate 111 and the upper substrate 112. For example, each of the plurality of upper plate patterns 121*b*, the plurality of lower plate patterns 121*a*, the plurality of upper line patterns 122*b*, and the plurality of lower line patterns 122*a* may include at least one material of polyimide (PI), polyacrylate, and polyacetate. According to an exemplary embodiment, each of the plurality of upper plate patterns 121*b*, the plurality of lower plate patterns 121*a*, the plurality of upper line patterns 122*b*, and the plurality of lower line patterns 122*a* may be formed of the same material, but is not limited thereto and may be formed of different materials. When the plurality of upper plate patterns 121*b*, the plurality of lower plate patterns 121*a*, the plurality of upper line patterns 122*b*, and the plurality of lower line patterns 122*a* are formed of the same material, the plurality of upper plate patterns 121*b* and the plurality of upper line patterns 122*b* may be integrally formed. Further, the plurality of lower plate patterns 121*a* and the plurality of lower line patterns 122*a* may be integrally formed.

In some exemplary embodiments, the lower substrate 111 may be defined to include a plurality of first lower patterns and a second lower pattern. The plurality of first lower patterns may be an area overlapping the plurality of upper plate patterns 121*b* and the plurality of lower plate patterns 121*a* of the lower substrate 111, but the second lower pattern may be an area which does not overlap the plurality of upper plate patterns 121*b* and lower plate patterns 121*a*.

Further, the upper substrate 112 may be defined to include a plurality of first upper patterns and a second upper pattern. The plurality of first upper patterns may be an area overlapping the plurality of upper plate patterns 121*b* and lower plate patterns 121*a* of the upper substrate 112, but the second upper pattern may be an area which does not overlap the plurality of upper plate patterns 121*b* and lower plate patterns 121*a*.

At this time, moduli of elasticity of the plurality of first lower patterns and the first upper pattern may be higher than moduli of elasticity of the second lower pattern and the second upper pattern. For example, the plurality of first lower patterns and first upper patterns may be formed of the same material as the plurality of upper plate patterns 121*b* and lower plate patterns 121*a*. The second lower pattern and the second upper pattern may be formed of a material having a modulus of elasticity lower than those of the plurality of upper plate patterns 121*b* and lower plate patterns 121*a*.

For example, the first lower pattern and the first upper pattern may also be formed of polyimide (PI), polyacrylate, or polyacetate. Further, the second lower pattern and the second upper pattern may be formed of silicon rubber such as polydimethylsiloxane (PDMS) or elastomer such as polyurethane (PU) or polytetrafluoroethylene (PTFE).

Driving Element of Non-Active Area

The gate driver GD may supply a gate voltage to the plurality of pixels PX disposed in the active area AA. The gate driver GD includes a plurality of stages formed on the plurality of lower plate patterns 121*a* disposed in the non-active area NA and each stage included in the gate driver GD may be electrically connected to each other by means of the plurality of gate connection lines. Accordingly, a gate voltage output from any one of stages may be transmitted to the other stage. Each stage may sequentially supply the gate voltage to the plurality of pixels PX connected to each stage.

The power supply PS is connected to the gate driver GD to supply a gate driving voltage and a gate clock voltage to the gate driver GD. The power supply PS is connected to the plurality of pixels PX to supply a pixel driving voltage to each of the plurality of pixels PX. Further, the power supply PS may be formed on the plurality of lower plate patterns 121*a* disposed in the non-active area NA. That is, the power supply PS may be formed on the plurality of lower plate patterns 121*a* disposed in the non-active area NA to be adjacent to the gate driver GD. A plurality of power supplies PS formed on the plurality of lower plate patterns 121*a* disposed in the non-active area NA may be electrically connected to the gate driver GD and the plurality of pixels PX. That is, the plurality of power supplies PS formed on the plurality of lower plate patterns 121*a* disposed in the non-active area NA may be connected to the gate driver GD and the plurality of pixels PX by a gate power connection line and a pixel power connection line. Therefore, each of the plurality of power supplies PS may supply a gate driving voltage, a gate clock voltage, and a pixel driving voltage.

The printed circuit board PCB may transmit signals and voltages for driving the display element from the control unit to the display element. Therefore, the printed circuit board PCB may also be referred to as a driving substrate. A control unit such as an IC chip or a circuit unit may be mounted on the printed circuit board PCB. Further, on the printed circuit board PCB, a memory or a processor may also be mounted. The printed circuit board PCB provided in the display device 100 may include a stretching area and a non-stretching area to ensure stretchability. In the non-stretching area, an IC chip, a circuit unit, a memory, and a processor may be mounted and in the stretching area, wiring lines which are electrically connected to the IC chip, the circuit unit, the memory, and the processor may be disposed.

The data driver DD may supply a data voltage to the plurality of pixels PX disposed in the active area AA. The data driver DD may be configured as an IC chip so that it may also be referred to as a data integrated circuit D-IC. The data driver DD may be mounted in the non-stretching area of the printed circuit board PCB. That is, the data driver DD may be mounted on the printed circuit board PCB in the form of a chip on board (COB). Even though in FIG. 1, it is illustrated that the data driver DD is mounted in a chip on film (COF) manner, it is not limited thereto and the data driver DD may also be mounted by a chip on board (COB), a chip on glass (COG), or a tape carrier package (TCP) manner.

Further, even though in FIG. 1, one data driver DD is disposed so as to correspond to one line of the lower plate patterns 121*a* disposed in the active area AA, it is not limited thereto. For example, one data driver DD may be disposed so as to correspond to a plurality of lines of lower plate patterns 121*a*.

Hereinafter, the active area AA of the display device 100 according to the exemplary embodiment of the present disclosure will be described in more detail with reference to FIGS. 4 and 5 together.

Planar and Cross-Sectional Structures of Active Area

Referring to FIGS. 2 and 4, a pixel PX including the plurality of sub pixels SPX may be disposed in the lower plate pattern 121*a* disposed on the lower substrate 111. Each of the plurality of sub pixels SPX may include a light emitting diode 170 which is a display element and a driving transistor 160 and a switching transistor 150 which drive the light emitting diode 170. However, in the sub pixel SPX, the display element is not limited to an LED, and may also be changed to an organic light emitting diode. For example, the plurality of sub pixels SPX may include a red sub pixel, a green sub pixel, and a blue sub pixel, but is not limited thereto and colors of the plurality of sub pixels SPX may be modified to various colors as needed.

The plurality of sub pixels SPX may be connected to the plurality of lower connection lines 181*a* and 182*a*. For example, the plurality of sub pixels SPX may be electrically connected to the first lower connection line 181*a* extending in the first direction X and the plurality of sub pixels SPX may be electrically connected to the second lower connection line 182*a* extending in the second direction Y.

Referring to FIGS. 3 and 4, a conductive pattern CP may be disposed in the upper plate pattern 121*b* disposed on the upper substrate 112. The plurality of conductive patterns CP may be connected to the plurality of upper connection lines 181*b*. The upper connection line 181*b* extends in the first direction X to be electrically connected to the plurality of conductive patterns CP.

Hereinafter, a cross-sectional structure of the active area AA will be described in more detail with reference to FIG. 4.

Referring to FIG. 4, a plurality of inorganic insulating layers may be disposed on the plurality of lower plate patterns 121*a*. For example, a plurality of inorganic insulating layers may include a buffer layer 141, a gate insulating layer 142, a first interlayer insulating layer 143, a second interlayer insulating layer 144, and a passivation layer 145. However, the exemplary embodiment of the present disclosure is not limited thereto and various inorganic insulating layers are additionally disposed on the plurality of lower plate patterns 121*a*. At least one of the buffer layer 141, the gate insulating layer 142, the first interlayer insulating layer 143, the second interlayer insulating layer 144, and the passivation layer 145 which are inorganic insulating layers may also be omitted.

To be more specific, a buffer layer 141 may be disposed on the plurality of lower plate patterns 121*a*. The buffer layer 141 may be formed on the plurality of lower plate patterns 121*a* to protect various components of the display device 100 from permeation of moisture ($H_2O$) and oxygen ($O_2$) from the outside of the lower substrate 111 and the plurality of lower plate patterns 121*a*. The buffer layer 141 may be configured by an insulating material. For example, the buffer layer 141 may be configured by a single layer or a double layer formed of at least one of silicon nitride (SiNx), silicon oxide (SiOx), and silicon oxynitride (SiON). However, the buffer layer 141 may also be omitted depending on a structure or a characteristic of the display device 100.

Here, the buffer layer 141 may be formed only in an area where the lower substrate 111 overlaps the plurality of lower plate patterns 121*a*. As described above, the buffer layer 141 may be formed of an inorganic material so that the buffer layer 141 may be easily cracked or damaged during a process of stretching the display device 100. Therefore, the buffer layer 141 is not formed in an area between the plurality of lower plate patterns 121*a*, but may be patterned to have a shape of the plurality of lower plate patterns 121*a* to be formed only above the plurality of lower plate patterns 121*a*. Therefore, in the display device 100 according to the exemplary embodiment of the present disclosure, the buffer layer 141 is formed only in an area overlapping the plurality of lower plate patterns 121*a* which are rigid patterns. Therefore, even though the display device 100 is bent or extended to be deformed, the damage of various components of the display device 100 may be suppressed.

A switching transistor 150 including a gate electrode 151, an active layer 152, a source electrode 153, and a drain electrode 154 and a driving transistor 160 including a gate electrode 161, an active layer 162, a source electrode and a drain electrode 164 may be formed on the buffer layer 141.

First, the active layer 152 of the switching transistor 150 and the active layer 162 of the driving transistor 160 may be disposed on the buffer layer 141. For example, each of the active layer 152 of the switching transistor 150 and the active layer 162 of the driving transistor 160 may also be formed of oxide semiconductors. Alternatively, the active layer 152 of the switching transistor 150 and the active layer 162 of the driving transistor 160 may be formed of amorphous silicon (a-Si), polycrystalline silicon (poly-Si), or an organic semiconductor.

The gate insulating layer 142 may be disposed on the active layer 152 of the switching transistor 150 and the active layer 162 of the driving transistor 160. The gate insulating layer 142 electrically insulates the gate electrode 151 of the switching transistor 150 from the active layer 152 of the switching transistor 150 and may electrically insulate the gate electrode 161 of the driving transistor 160 from the active layer 162 of the driving transistor 160. The gate insulating layer 142 may include an insulating material. For example, the gate insulating layer 142 may be configured by a single layer of silicon nitride (SiNx) or silicon oxide (SiOx) which is an inorganic material or a multiple layer of silicon nitride (SiNx) or silicon oxide (SiOx), but it is not limited thereto.

The gate electrode 151 of the switching transistor 150 and the gate electrode 161 of the driving transistor 160 may be disposed on the gate insulating layer 142. The gate electrode 151 of the switching transistor 150 and the gate electrode 161 of the driving transistor 160 may be disposed on the gate insulating layer 142 to be spaced apart from each other. The gate electrode 151 of the switching transistor 150 overlaps the active layer 152 of the switching transistor 150 and the gate electrode 161 of the driving transistor 160 may overlap the active layer 162 of the driving transistor 160.

The gate electrode 151 of the switching transistor 150 and the gate electrode 161 of the driving transistor 160 may be any one of various metal materials such as molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

The first interlayer insulting layer 143 may be disposed on the gate electrode 151 of the switching transistor 150 and the gate electrode 161 of the driving transistor 160. The first interlayer insulating layer 143 may insulate the gate electrode 161 of the driving transistor 160 from an intermediate metal layer IM. The first interlayer insulating layer 143 may be formed of an inorganic material, similarly to the buffer layer 141. For example, the first interlayer insulating layer 143 may be configured by a single layer of silicon nitride (SiNx) or silicon oxide (SiOx) which is an inorganic material or a multiple layer of silicon nitride (SiNx) or silicon oxide (SiOx), but it is not limited thereto.

The intermediate metal layer IM may be disposed on the first interlayer insulating layer 143. The intermediate metal layer IM may overlap the gate electrode 161 of the driving transistor 160. Therefore, a capacitor (for example, a storage capacitor) may be formed in an overlapping area of the intermediate metal layer IM and the gate electrode 161 of the driving transistor 160. Specifically, the storage capacitor may be formed by the gate electrode 161 of the driving transistor 160, the first interlayer insulating layer 143, and the intermediate metal layer IM. However, the placement area of the intermediate metal layer IM is not limited thereto and the intermediate metal layer IM overlaps the other electrode to form the storage capacitor in various forms.

The intermediate metal layer IM may be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

The second interlayer insulating layer 144 may be disposed on the intermediate metal layer IM. The second interlayer insulating layer 144 may insulate the gate electrode 151 of the switching transistor 150 from the source electrode 153 and the drain electrode 154 of the switching transistor 150. The second interlayer insulating layer 144 may insulate the intermediate metal layer IM from the source electrode and the drain electrode 164 of the driving transistor 160. The second interlayer insulating layer 144 may be formed of an inorganic material, which is the same as the buffer layer 141. For example, the second interlayer insulating layer 144 may be configured by a single layer of silicon nitride (SiNx) or silicon oxide (SiOx) which is an inorganic material or a multiple layer of silicon nitride (SiNx) or silicon oxide (SiOx), but it is not limited thereto.

The source electrode 153 and the drain electrode 154 of the switching transistor 150 may be disposed on the second interlayer insulating layer 144. The source electrode and the drain electrode 164 of the driving transistor 160 may be disposed on the second interlayer insulating layer 144. The source electrode 153 and the drain electrode 154 of the switching transistor 150 may be disposed on the same layer to be spaced apart from each other. Even though in FIG. 4, the source electrode of the driving transistor 160 is omitted, the source electrode of the driving transistor 160 may also be disposed to be spaced apart from the drain electrode 164 on the same layer. In the switching transistor 150, the source electrode 153 and the drain electrode 154 may be in contact with the active layer 152 to be electrically connected to the active layer 152. In the driving transistor 160, the source electrode and the drain electrode 164 may be in contact with the active layer 162 to be electrically connected to the active layer 162. The drain electrode 154 of the switching transistor 150 is in contact with the gate electrode 161 of the driving transistor 160 through a contact hole to be electrically connected to the gate electrode 161 of the driving transistor 160.

The source electrode 153 and the drain electrodes 154 and 164 may include any one of various metal materials such as molybdenum (Mo), aluminum (Al), chrome (Cr), gold (Au), titanium (Ti), nickel (Ni), neodymium (Nd), and copper (Cu) or an alloy of two or more of them, or a multiple layer thereof, but they are not limited thereto.

Further, in this specification, even though it is described that the driving transistor 160 has a coplanar structure, various transistors such as a staggered structure may also be used. Further, in this specification, the transistor may also be formed not only to have a top gate structure, but also to have a bottom gate structure.

A gate pad and a data pad DP may be disposed on the second interlayer insulating layer 144.

Specifically, the gate pad may be a pad which transmits a gate voltage to the plurality of sub pixels SPX. The gate pad may be connected to the first lower connection line 181*a* through a contact hole. Further, the gate voltage supplied from the first lower connection line 181*a* may be transmitted to the gate electrode 151 of the switching transistor 150 from the gate pad through a wiring line formed on the lower plate pattern 121*a*.

The data pad DP may be a pad which transmits a data voltage to the plurality of sub pixels SPX. The data pad DP may be connected to the second lower connection line 182*a* through a contact hole. Further, the data voltage supplied from the second lower connection line 182*a* may be transmitted to the source electrode 153 of the switching transistor 150 from the data pad DP through a wiring line formed on the lower plate pattern 121*a*.

A voltage pad VP may be a pad which transmits a high potential voltage to the plurality of sub pixels SPX. The voltage pad VP may be connected to the first lower connection line 181*a* through a contact hole. Further, a high potential voltage supplied from the first lower connection line 181*a* may be transmitted to the driving transistor 160 from the voltage pad VP through a wiring line formed on the lower plate pattern 121*a*. The above-described high potential voltage may be referred to as a second driving voltage and a low potential voltage to be described below may be referred to as a first driving voltage.

The gate pad, the data pad DP, and the voltage pad VP may be formed of the same material as the source electrode 153 and the drain electrodes 154 and 164, but are not limited thereto.

The passivation layer 145 may be formed on the switching transistor 150 and the driving transistor 160. That is, the passivation layer 145 may be disposed to cover the switching transistor 150 and the driving transistor 160 so that the switching transistor 150 and the driving transistor 160 are protected from the permeation of moisture and oxygen. The passivation layer 145 may be formed of an inorganic material and configured by a single layer or a double layer, but is not limited thereto.

The gate insulating layer 142, the first interlayer insulating layer 143, the second interlayer insulating layer 144, and the passivation layer 145 are patterned to be formed only in an area overlapping the plurality of lower plate patterns 121*a*. The gate insulating layer 142, the first interlayer insulating layer 143, the second interlayer insulting layer 144, and the passivation layer 145 may also be formed of the inorganic material, similar to the buffer layer 141. Therefore, the gate insulating layer 142, the first interlayer insulating layer 143, the second interlayer insulating layer 144, and the passivation layer 145 may also be easily cracked to be damaged during the process of stretching the display device 100. Therefore, the gate insulating layer 142, the first interlayer insulating layer 143, the second interlayer insulating layer 144, and the passivation layer 145 are not formed in an area between the plurality of lower plate patterns 121*a*, but are patterned to have a shape of the plurality of lower plate patterns 121*a* to be formed only above the plurality of lower plate patterns 121*a*.

The planarization layer 146 may be formed on the passivation layer 145. The planarization layer 146 may planarize upper portions of the switching transistor 150 and the driving transistor 160. The planarization layer 146 may be configured by a single layer or a plurality of layers and may be formed of an organic material. Therefore, the additional planarization layer 146 may also be referred to as an organic insulating layer. For example, the planarization layer 146 may be formed of an acrylic organic material, but is not limited thereto.

Referring to FIG. 4, the planarization layer 146 may be disposed so as to cover top surfaces and side surfaces of the buffer layer 141, the gate insulating layer 142, the first interlayer insulating layer 143, the second interlayer insulating layer 144, and the passivation layer 145 on the plurality of lower plate patterns 121*a*. Further, the planarization layer 146 may enclose the buffer layer 141, the gate insulating layer 142, the first interlayer insulating layer 143, the second interlayer insulating layer 144, and the passivation layer 145 together with the plurality of lower plate patterns 121*a*. To be more specific, the planarization layer 146 may be disposed so as to cover a top surface and a side surface of the passivation layer 145, a side surface of the first interlayer insulating layer 143, a side surface of the second interlayer insulating layer 144, a side surface of the gate insulating layer 142, a side surface of the buffer layer 141, and a part of a top surface of the plurality of lower plate patterns 121*a*. Accordingly, the planarization layer 144 may supplement a step on side surfaces of the buffer layer 141, the gate insulating layer 142, the first interlayer insulating layer 143, the second interlayer insulating layer 144, and the passivation layer 145. Further, the planarization layer 146 may enhance an adhesive strength with the lower connection lines 181*a* and 182*a* disposed on a side surface of the planarization layer 146.

Referring to FIG. 4, an inclination angle of the side surface of the planarization layer 146 may be smaller than an inclination angle formed by side surfaces of the buffer layer 141, the gate insulating layer 142, the first interlayer insulating layer 143, the second interlayer insulating layer 144, and the passivation layer 145. For example, the side surface of the planarization layer 146 may have a slope which is gentler than a slope formed by each of the side surface of the passivation layer 145, the side surface of the first interlayer insulating layer 143, the side surface of the second interlayer insulating layer 144, the side surface of the gate insulating layer 142, and the side surface of the buffer layer 141. Therefore, the lower connection lines 181*a* and 182*a* which are disposed to be in contact with the side surface of the planarization layer 146 are disposed with a gentle slope so that when the display device 100 is stretched, the stress generated in the lower connection lines 181*a* and 182*a* may be reduced. Further, the side surface of the planarization layer 146 has a relatively gentle slope so that the crack of the lower connection lines 181*a* and 182*a* or separation from the side surface of the planarization layer 146 may be suppressed.

Referring to FIGS. 2 to 4, the lower connection lines 181*a* and 182*a* refer to wiring lines which electrically connect the pads on the plurality of lower plate patterns 121*a*. The lower connection lines 181*a* and 182*a* may be disposed on the plurality of lower line patterns 122*a*. Further, the lower line pattern 122*a* is not disposed in an area between the plurality of lower plate patterns 121*a* in which the lower connection lines 181*a* and 182*a* are not disposed.

The lower connection lines 181*a* and 182*a* may include a first lower connection line 181*a* and a second lower connection line 182*a*. The first lower connection line 181*a* and the second lower connection line 182*a* may be disposed between the plurality of lower plate patterns 121*a*. Specifically, the first lower connection line 181*a* refers to a wiring line extending in a first direction X between the plurality of lower plate patterns 121*a*, among the lower connection lines 181*a* and 182*a*. The second lower connection line 182*a* may refer to a wiring line extending in a second direction Y between the plurality of lower plate patterns 121*a*, among the lower connection lines 181*a* and 182*a*.

The lower connection lines 181*a* and 182*a* may be formed of a metal material such as copper (Cu), aluminum (Al), titanium (Ti), and molybdenum (Mo) or a stacked structure of metal materials such as copper/molybdenum-titanium (Cu/MoTi) or titanium/aluminum/titanium (Ti/Al/Ti), but is not limited thereto.

In the case of a display panel of a general display device, various wiring lines such as a plurality of gate lines and a plurality of data lines extend between the plurality of sub pixels as a straight line and the plurality of sub pixels is connected to one signal line. Therefore, in the display panel of the general display device, various wiring lines, such as a gate line, a data line, a high potential voltage line, and a reference voltage line, may extend from one side to the other side of the display panel of the organic light emitting display device without being disconnected on the substrate.

In contrast, in the display device 100 according to the exemplary embodiment of the present disclosure, various wiring lines, such as a gate line, a data line, a high potential voltage line, a reference voltage line, or an initialization voltage line having a straight line shape which are considered to be used for the display panel of the general display device, may be disposed only on the plurality of lower plate patterns 121*a*. That is, in the display device 100 according to the exemplary embodiment of the present disclosure, a linear wiring line may be disposed only on the plurality of lower plate patterns 121*a*.

In the display device 100 according to the exemplary embodiment of the present disclosure, the pads on two adjacent lower plate patterns 121*a* may be connected by the lower connection lines 181*a* and 182*a*. Accordingly, the lower connection lines 181*a* and 182*a* may electrically connect the gate pads, the data pads DP, or the voltage pad VP on two adjacent lower plate patterns 121*a*. Accordingly, the display device 100 according to the exemplary embodiment of the present disclosure may include a plurality of lower connection lines 181*a* and 182*a* which electrically connects various wiring lines, such as a gate line, a data line, a high potential voltage line, and a reference voltage line, between the plurality of lower plate patterns 121*a*. For example, the gate line may be disposed on the plurality of lower plate patterns 121*a* disposed to be adjacent to each other in the first direction X and the gate pad may be disposed on both ends of the gate line. In this case, the plurality of gate pads on the plurality of lower plate patterns 121*a* adjacent to each other in the first direction X may be connected to each other by the first lower connection line 181*a* which serves as a gate line. Therefore, the gate line disposed on the plurality of lower plate patterns 121*a* and the first lower connection line 181*a* disposed on the lower line pattern 122*a* may serve as one gate line. The above-described gate line may be referred to as a scan signal line. Further, wiring lines which extend in the first direction X, among all various wiring lines which may be included in the display device 100, such as an emission signal line and a high potential voltage line, may also be electrically connected by the first lower connection line 181*a*, as described above.

Referring to FIGS. 2 and 4, the first lower connection lines 181*a* may connect the voltage pads VP on two lower plate patterns 121*a* which are disposed side by side, among the voltage pads VP on the plurality of lower plate patterns 121*a* disposed to be adjacent in the first direction X. The first lower connection line 181*a* may serve as a scan signal line and an emission signal line which are gate lines, but is not limited thereto. The voltage pad VP on the plurality of lower plate patterns 121*a* disposed in the first direction X may be connected by the first lower connection line 181*a* serving as a high potential voltage line and transmitted one high potential voltage.

Further, the second lower connection line 182*a* may connect the data pads DP on two lower plate patterns 121*a* which are disposed side by side, among the data pads DP on the plurality of lower plate patterns 121*a* disposed to be adjacent in the second direction Y. The second lower connection line 182*a* may server as a data line or a reference voltage line, but is not limited thereto. An internal line on the plurality of lower plate patterns 121*a* disposed in the second direction Y may be connected by the plurality of second lower connection lines 182*a* serving as a data line and transmitted one data voltage.

As illustrated in FIG. 4, the first lower connection line 181*a* may be disposed to be in contact with a top surface and a side surface of the planarization layer 146 disposed on the lower plate pattern 121*a*. The first lower connection line 181*a* may extend to the top surface of the lower line pattern 122*a*. Further, the second lower connection line 182*a* may be disposed to be in contact with a top surface and a side surface of the planarization layer 146 disposed on the lower plate pattern 121*a*. The second lower connection line 182*a* may extend to the top surface of the lower line pattern 122*a*.

However, there is no need to dispose a rigid pattern in an area in which the first lower connection line 181*a* and the second lower connection line 182*a* are not disposed, so that the lower line pattern 122*a* which is a rigid pattern is not disposed below the first lower connection line 181*a* and the second lower connection line 182*a*.

In the meantime, referring to FIG. 4, a bank 147 may be formed on the connection pad CNT, the lower connection lines 181*a* and 182*a*, and the planarization layer 146. The bank 147 is a component which may divide adjacent sub pixels SPX. The bank 147 may be disposed so as to cover at least a part of the connection pad CNT, the lower connection lines 181*a* and 182*a*, and the planarization layer 146. The bank 147 may be formed of an insulating material. Further, the bank 147 may include a black material. The bank 147 includes the black material to block wiring lines which may be visible through the active area AA. For example, the bank 147 may be formed of a carbon based mixture and for example, include carbon black. However, it is not limited thereto and the bank 147 may be formed of a transparent insulating material. Even though in FIG. 4, it is illustrated that a height of the bank 147 is lower than a height of the light emitting diode 170, the present disclosure is not limited thereto and the height of the bank 147 may be equal to the height of the light emitting diode 170.

In the meantime, referring to FIG. 3, with respect to the upper substrate 112, the plurality of upper plate patterns 121*b* and the plurality of upper line patterns 122*b* which connects the plurality of upper plate patterns 121*b* may be disposed on the upper substrate 112. Referring to FIG. 4, with respect to the upper substrate 112, the plurality of upper plate patterns 121*b* and the plurality of upper line patterns 122*b* which connects the plurality of upper plate patterns 121*b* may be disposed below the upper substrate 112. That is, the plurality of upper plate patterns 121*b* and the plurality of upper line patterns 122*b* may be disposed to be in contact with the upper substrate 112.

Specifically, the plurality of upper line patterns 122*b* connects upper plate patterns 121*b* which are disposed to be adjacent to each other in the first direction X. Therefore, the plurality of upper line patterns 122*b* may extend in the first direction X. However, it is not limited thereto and the plurality of upper line patterns 122*b* may extend in the first direction X or in each of the first direction X and the second direction Y.

With respect to the upper substrate 112, the conductive pattern CP may be disposed on the upper plate pattern 121*b* and the upper connection line 181*b* may be disposed on the upper line pattern 122*b*. With respect to the upper substrate 112, the conductive pattern CP may be disposed below the upper plate pattern 121*b* and the upper connection line 181*b* may be disposed below the upper line pattern 122*b*.

The conductive pattern CP may have the same shape as the upper plate pattern 121*b*. For example, the upper plate pattern 121*b* has island shapes which are spaced apart from each other so that the conductive patterns CP may also have island shapes which are spaced apart from each other. However, the shape of the conductive pattern CP is not limited thereto and may vary with various shapes overlapping the shape of the upper plate pattern 121*b*.

The upper connection line 181*b* may also have the same shape as the upper line pattern 122*b*. For example, the upper connection line 181*b* may also have a sinusoidal shape. However, it is just illustrative, so that the shape of the plurality of upper connection lines 181*b* is not limited thereto. For example, the plurality of upper line patterns 122*b* and the plurality of upper connection lines 181*b* may also have a zigzag shape. As another example, the plurality of upper connection lines 181*b* may also have various shapes, such as a plurality of rhombic shapes being connected and extending at vertices.

The plurality of conductive patterns CP and the plurality of upper connection line 181*b* may be formed of a metal material such as copper (Cu), aluminum (Al), titanium (Ti), and molybdenum or a stacked structure of metal materials such as copper/molybdenum-titanium (Cu/MoTi) or titanium/aluminum/titanium (Ti/Al/Ti). However, it is not limited thereto. The plurality of conductive patterns CP and the plurality of upper connection lines 181*b* may be integrally formed, but it is not limited thereto.

A low potential voltage for driving the light emitting diode 170 may be applied to the plurality of conductive patterns CP and the plurality of upper connection lines 181*b*. That is, the plurality of conductive patterns CP and the plurality of upper connection lines 181*b* may configure a conductive surface to which one low potential voltage is applied.

Planar and Cross-Sectional Structures of Light Emitting Diode

Figure 5:
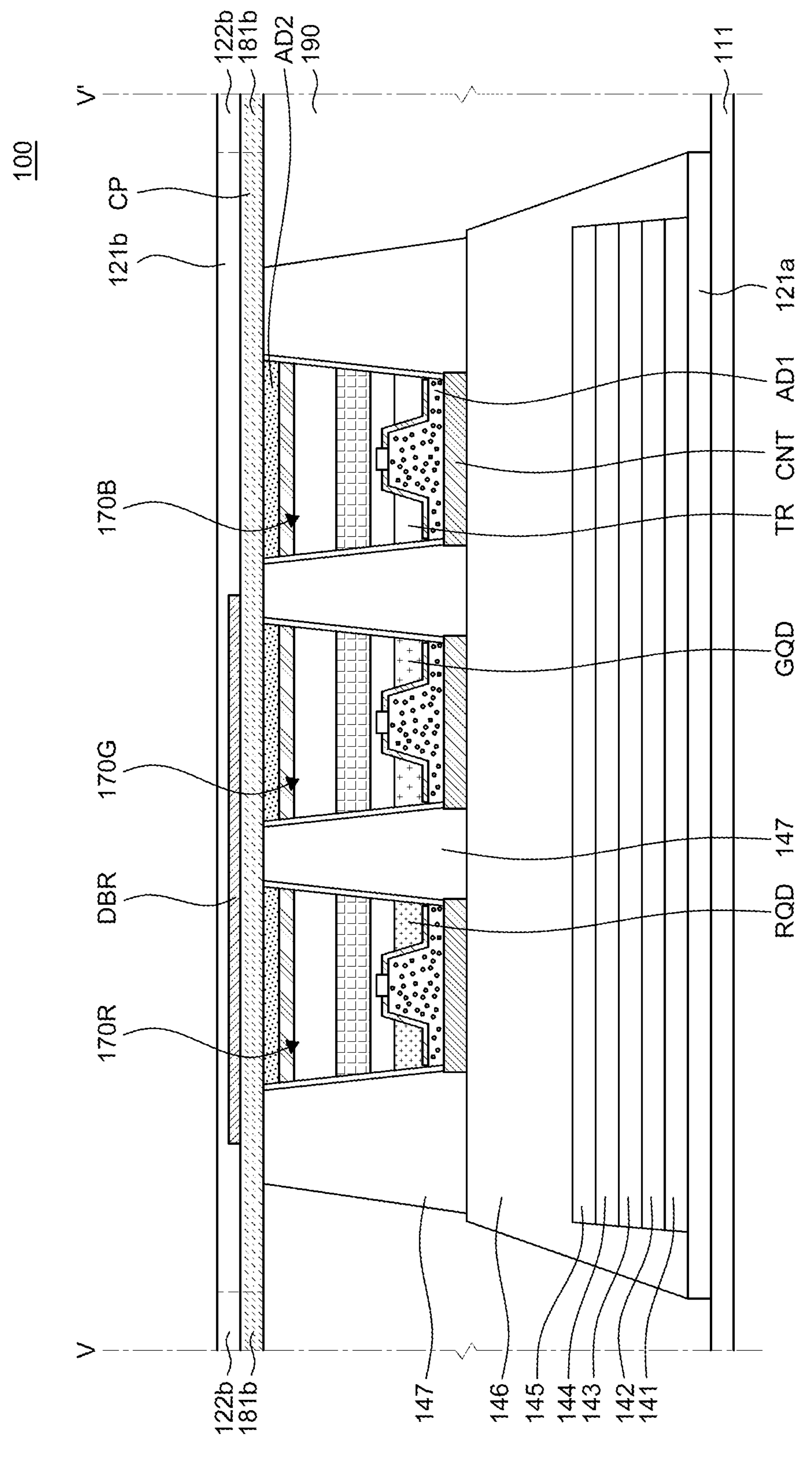
FIG. 5 is a cross-sectional view taken along the line V-V' of FIGS. 2 and 3.

FIG. 5 is a cross-sectional view taken along the line V-V' of FIGS. 2 and 3.

Referring to FIG. 4, the light emitting diode 170 may be disposed on the connection pad CNT. The light emitting diode 170 includes a first electrode 171, a first semiconductor layer 172, an emission layer 173, a second semiconductor layer 174, and a second electrode 175. The first semiconductor layer 172, the emission layer 173, the second semiconductor layer 174, and the second electrode 175 may be sequentially disposed on the first electrode 171. Therefore, the light emitting diode 170 is a vertical light emitting diode 170 in which the second electrode 175 is disposed above based on a vertical direction of the first electrode 171.

The first semiconductor layer 172 is disposed on the first electrode 171 and the second semiconductor layer 174 is disposed on the first semiconductor layer 172. The first semiconductor layer 172 and the second semiconductor layer 174 may be layers formed by doping n-type and p-type impurities into a specific material. For example, the first semiconductor layer 172 and the second semiconductor layer 174 may be layers formed by doping p-type and n-type impurities into a material, such as gallium nitride (GaN), indium aluminum phosphide (InAlP), or gallium arsenide (GaAs). The p-type impurity may be magnesium (Mg), zinc (Zn), and beryllium (Be), and the n-type impurity may be silicon (Si), germanium, and tin (Sn), but are not limited thereto.

The emission layer 173 is disposed between the first semiconductor layer 172 and the second semiconductor layer 174. The emission layer 173 is supplied with holes and electrons from the first semiconductor layer 172 and the second semiconductor layer 174 to emit light. The emission layer 173 may be formed by a single layer or a multi-quantum well (MQW) structure, and for example, may be formed of indium gallium nitride (InGaN) or gallium nitride (GaN), but is not limited thereto.

The first electrode 171 is disposed below the first semiconductor layer 172. The first electrode 171 is an electrode which electrically connects the driving transistor 160 and the first semiconductor layer 172. The first electrode 171 may be configured by a conductive material, for example, a transparent conductive material, such as indium tin oxide (ITO) or indium zinc oxide (IZO) or an opaque conductive material, such as titanium (Ti), gold (Au), silver (Ag), copper (Cu) or an alloy thereof, but is not limited thereto.

The second electrode 175 is disposed on the second semiconductor layer 174. The second electrode 175 may be disposed on the top surface of the second semiconductor layer 174. The second electrode 175 is an electrode which electrically connects the conductive pattern CP and the second semiconductor layer 174. The second electrode 175 may be configured by a transparent conductive material, such as indium tin oxide (ITO) or indium zinc oxide (IZO) or an opaque conductive material, such as titanium (Ti), gold (Au), silver (Ag), copper (Cu) or an alloy thereof, but is not limited thereto.

The first adhesive layer AD1 is disposed between the connection pad CNT and the first electrode 171 so that the light emitting diode 170 may be bonded onto the connection pad CNT. The second adhesive layer AD2 is disposed between the conductive pattern CP and the second electrode 175 so that the light emitting diode 170 may be bonded below the conductive pattern CP.

Each of the first adhesive layer AD1 and the second adhesive layer AD2 may be conductive adhesive layers in which conductive balls are dispersed in an insulating base member. Therefore, when heat or a pressure is applied to the adhesive layers AD1 and AD2, the conductive balls are electrically connected in a portion applied with the heat or pressure to have a conductive property.

The connection pad CNT is electrically connected to the drain electrode 164 of the driving transistor 160 to be applied with a driving voltage from the driving transistor 160 to drive the light emitting diode 170. Even though in FIG. 4, it is illustrated that the connection pad CNT is not in direct contact with the drain electrode 164 of the driving transistor 160, but is in indirect contact therewith, the present disclosure is not limited thereto. Therefore, the connection pad CNT and the drain electrode 164 of the driving transistor 160 may also be in direct contact with each other. Further, a low potential voltage may be applied to the first lower connection line 181*a* to drive the light emitting diode 170.

Therefore, when the display device 100 is on, the driving voltage is applied to the first electrode 171 by means of the connection pad CNT and the low potential voltage may be applied to the second electrode by means of the conductive pattern CP. Therefore, different voltage levels are transmitted to each of the first electrode 171 and the second electrode 175 to allow the light emitting diode 170 to emit light.

The filling layer 190 may be disposed on the entire surface of the lower substrate 111 to be filled between the components disposed on the upper substrate 112 and the lower substrate 111. The filling layer 190 may be configured by a curable adhesive. Specifically, the material which configures the filling layer 190 is coated on the entire surface of the lower substrate 111 and then is cured so that the filling layer 190 may be disposed between the components disposed on the upper substrate 112 and the lower substrate 111. For example, the filling layer 190 may be an optically clear adhesive (OCA) and may be configured by an acrylic adhesive, a silicon based adhesive, and an urethane based adhesive.

As described above, the display device according to the exemplary embodiment of the present disclosure may supply a low potential voltage to the light emitting diode by means of the upper connection line 181*b* and the conductive pattern CP attached to the upper substrate 112.

A total area of the upper connection line 181*b* and the conductive pattern CP is larger than a total area of the lower connection lines 181*a* and 182*a* so that a total resistance of the upper connection line 181*b* and the conductive pattern CP may be relatively low.

Therefore, the voltage drop of the low potential voltage which is supplied through the upper connection line 181*b* and the conductive pattern CP may be suppressed. Accordingly, a stable low potential voltage may be supplied to the light emitting diode 170.

In the meantime, a quantum dot layer QD may be disposed in the light emitting diode 170.

As illustrated in FIG. 4, the quantum dot layer QD may be disposed between the first electrode 171 and the first semiconductor layer 172.

Quantum dots with various sizes may be disposed in the quantum dot layer QD. A wavelength of light emitted from the quantum dot layer QD may vary depending on the size of the quantum dot. For example, as the size of the quantum dot is increased, light with longer wavelength is emitted and as the size of the quantum dot is reduced, light with shorter wavelength is emitted.

The passivation layer PAS covers an outside of the light emitting diode 170 to protect. Specifically, the passivation layer PAS may be disposed so as to cover side surfaces of the first electrode 171, the first semiconductor layer 172, the emission layer 173, the second semiconductor layer 174, and the second electrode 175 of the light emitting diode, and a side surface of the quantum dot layer QD.

Therefore, the outer surface of the quantum dot layer QD may be covered by the first electrode 171, the first semiconductor layer 172, and the passivation layer PAS.

The passivation layer PAS may be configured by a single layer or a double layer formed of at least one of silicon nitride (SiNx), silicon oxide (SiOx), and silicon oxynitride (SiON).

Quantum dots disposed in the quantum dot layer QD are very vulnerable to external moisture or oxygen due to the nature of the material. Accordingly, the encapsulation over the quantum dot layer QD is essential to consistently maintain a same level of efficiency.

The display device 100 according to the exemplary embodiment of the present disclosure is advantageous in that the quantum dot layer QD is disposed in the light emitting diode 170 so that the quantum dot layer QD may be encapsulated without a separate encapsulation layer.

Therefore, the reliability of the quantum dot layer QD of the display device 100 according to the exemplary embodiment of the present disclosure is improved thereby further enhancing the reliability for implementing the image of the display device. In addition, because a separate encapsulation layer is not necessary, the thickness of the display device can be reduced and the manufacturing process for adding the separate encapsulation layer can be removed thereby reducing the overall cost of the display device.

Referring to FIG. 4, the first electrode 171 includes a first portion FP, an inclined portion IP, and a second portion SP. The first portion FP of the first electrode 171 is a portion on the first adhesive layer AD1. The first portion FP has a first surface FS that is substantially planar. The inclined portion IP has a first inclined surface FIS that has a first inclination angle θ1. The second portion SP has a second surface SS that is substantially planar. The inclined portion IP is between the first portion FP and the second portion SP, and the first surface FS and the first inclined surface FIS are continuously connected and the second surface SS and the first inclined surface FIS are continuously connected.

In some embodiments, the quantum dot layer QD is adjacent to and in contact with the first surface FS of the first portion FP and the first inclined surface FIS of the inclined portion IP. The quantum dot layer QD includes a third surface TS that is substantially planar. The third surface TS may also be referred to as a top surface of the quantum dot layer QD. Here, the third surface TS of the quantum dot layer QD is spaced apart from the second surface SS of the second portion SP. Further, in some embodiments, the third surface TS of the quantum dot layer QD is closer to the lower substrate 111 compared to the second surface SS of the second portion SP of the first electrode 171. As shown, a distance D1 between an upper surface or top surface 111TS of the lower substrate 111 and the third surface TS of the quantum dot layer QD is smaller than a distance D2 between an upper surface 111TS of the lower substrate 111 and the second surface SS of the second portion SP of the first electrode 171.

In some embodiments, the third surface TS of the quantum dot layer QD is adjacent to and in contact with the first semiconductor layer 172. That is, the third surface TS of the quantum dot layer QD directly contacts the first semiconductor layer 172.

In some embodiments, the passivation layer PAS is adjacent to the quantum dot layer QD. As shown in FIG. 4, the passivation layer PAS has a second inclined surface SIS that has a second inclination angle θ2. In some embodiments, the second inclined surface SIS of the passivation layer PAS and the first inclined surface FIS of the inclined portion IP of the first electrode 171 have a different inclination angle from each other. In one embodiment, the second inclination angle θ2 may be greater than the first inclination angle θ1. In other embodiments, the second inclination angle θ2 may be smaller than the first inclination angle θ1.

The second inclined surface SIS the passivation layer PAS is adjacent to and in contact with the quantum dot layer QD. The second inclined surface SIS the passivation layer PAS may refer to a surface that faces inwards to the light emitting diode.

In the meantime, referring to FIG. 5, the plurality of light emitting diodes may include a first light emitting diode 170R configured to emit light with a first wavelength, a second light emitting diode 170G configured to emit light with a second wavelength, and a third light emitting diode 170B configured to emit light with a third wavelength.

The first wavelength is longer than the second wavelength and the second wavelength is longer than the third wavelength. For example, the first wavelength corresponds to a wavelength of red, the second wavelength corresponds to a wavelength of green, and the third wavelength corresponds to a wavelength of blue.

The first light emitting diode 170R includes a first quantum dot layer RQD, the second light emitting diode 170G includes a second quantum dot layer GQD, and the third light emitting diode 170B includes a transmission layer TR.

A placement relationship of the first quantum dot layer RQD, the second quantum dot layer GQD, and the transmission layer TR may be equal to the placement relationship of the quantum dot layer QD described above with reference to FIG. 4. Therefore, in one embodiment, the thicknesses of the first quantum dot layer RQD, the second quantum dot layer GQD, and the transmission layer TR may be the same.

The first quantum dot layer RQD converts light with a third wavelength into a first wavelength and the second quantum dot layer GQD may convert the light with the third wavelength into a second wavelength.

Therefore, referring to FIGS. 4 and 5, the emission layer of the first light emitting diode 170R generates light with the third wavelength and the first quantum dot layer RQD of the first light emitting diode 170R converts light with the third wavelength into light with the first wavelength. As a result, the first light emitting diode 170R may emit light with the first wavelength.

The emission layer of the second light emitting diode 170G generates light with the third wavelength and the second quantum dot layer GOD of the second light emitting diode 170G converts light with the third wavelength into light with the second wavelength. As a result, the second light emitting diode 170G may emit light with the second wavelength.

The emission layer of the third light emitting diode 170B generates light with the third wavelength and the third light emitting diode 170B may emit light with the third wavelength by means of the transmission layer TR.

As described above, the first light emitting diode 170R and the second light emitting diode 170G may emit light by means of color conversion through the first quantum dot layer RQD and the second quantum dot layer GQD.

The above-described passivation layer PAS has a low refractive characteristic in a long wavelength as compared with a short wavelength. Therefore, when a red shift occurs by the color conversion by means of the first quantum dot layer RQD and the second quantum dot layer GQD, an angle at which total reflection occurs on an interface of the passivation layer PAS is increased. Therefore, the total reflection efficiently occurs on the passivation layer PAS of the display device according to the exemplary embodiment of the present disclosure so that the light loss may be reduced or minimized.

Therefore, the luminous efficiency of the display device according to the exemplary embodiment of the present disclosure may be increased.

Further, in the display device according to the exemplary embodiment of the present disclosure, a distributed Bragg reflector (DBR) which is one type of a reflector may be disposed on the first light emitting diode 170R and the second light emitting diode 170G.

The distributed Bragg reflector DBR reflects light with the third wavelength and may transmit light with the first wavelength and the second wavelength. Other suitable reflector capable of performing the same or similar reflecting properties may be utilized.

That is, in each of the first light emitting diode 170R and the second light emitting diode 170G, the color conversion is not performed by the first quantum dot layer RQD and the second quantum dot layer GQD, but the light with the third wavelength may be upwardly emitted.

Therefore, the distributed Bragg reflector DBR downwardly reflects the light with the third wavelength which is emitted from each of the first light emitting diode 170R and the second light emitting diode 170G to reuse the light.

Therefore, the light with the third wavelength which is reflected to the first quantum dot layer RQD and the second quantum dot layer GQD by the distributed Bragg reflector DBR may be converted again into light with the first wavelength or light with the second wavelength.

Therefore, the luminous efficiency of the light with the first wavelength emitted from the first light emitting diode 170R of the display device according to the exemplary embodiment of the present disclosure and the luminous efficiency of the light with the second wavelength emitted from the second light emitting diode 170G may be increased.

In some embodiments, the distributed Bragg reflector DBR is on the first light emitting diode 170R, the second light emitting diode 170G, and the third light emitting diode 170B. However, the distributed Bragg reflector DBR is laterally spaced apart from the third light emitting diode 170B. That is, the distributed Bragg reflector DBR overlaps first light emitting diode 170R, the second light emitting diode 170G from a plan view. On the other hand, the distributed Bragg reflector DBR does not overlap with the third light emitting diode 170B from a plan view.

Consequently, the color purity of the display device according to the exemplary embodiment of the present disclosure may be improved.

Another Exemplary Embodiment of Present Disclosure

Hereinafter, a display device according to another exemplary embodiment of the present disclosure will be described. The difference between the display device according to the exemplary embodiment of the present disclosure and a display device according to another exemplary embodiment of the present disclosure is a type of a light emitting diode, which will be mainly described. In the display device according to the exemplary embodiment of the present disclosure and the display device according to another exemplary embodiment of the present disclosure, like component is denoted by like reference numeral and a redundant description will be omitted.

Figure 6:
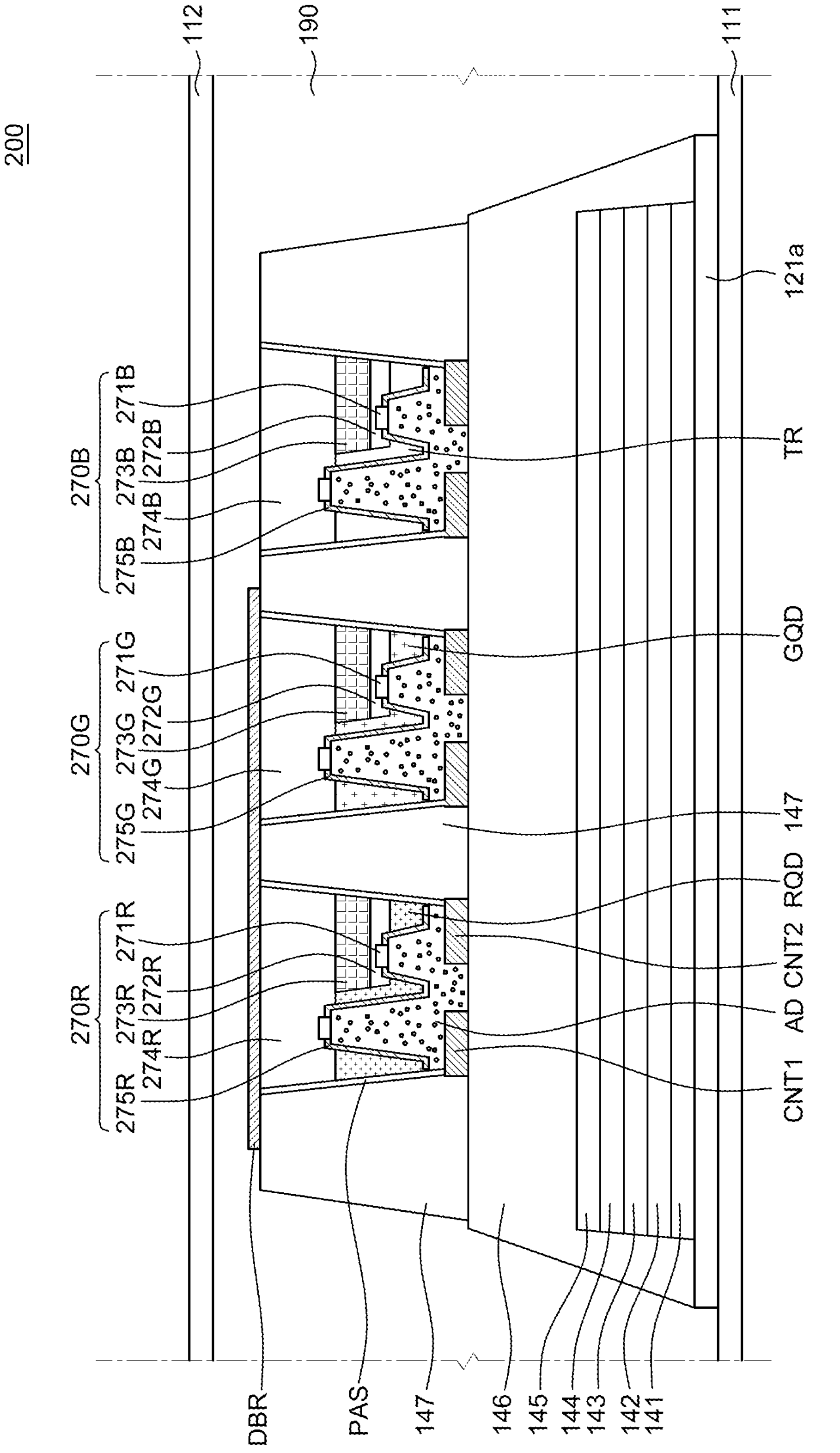
FIG. 6 is a cross-sectional view of a display device according to another exemplary embodiment of the present disclosure.

FIG. 6 is a cross-sectional view of a display device according to another exemplary embodiment of the present disclosure.

Referring to FIG. 6, the plurality of light emitting diodes includes a first light emitting diode 270R, a second light emitting diode 270G, and a third light emitting diode 270B and each of the light emitting diodes 270R, 270G, and 270B may be disposed on the first connection pad CNT1 and the second connection pad CNT2. The light emitting diodes 270R, 270G, and 270B may include second semiconductor layers 274R, 274G, and 274B, emission layers 273R, 273G, and 273B, first semiconductor layers 272R, 272G, and 272B, second electrodes 275R, 275G, and 275B, and first electrodes 271R, 271G, and 271B, respectively. The light emitting diodes 270R, 270G, and 270B of the display device 200 according to another exemplary embodiment of the present disclosure may have a flip-chip structure in which the second electrodes 275R, 275G, and 275B and the first electrodes 271R, 271G, and 271B are formed on one surface. That is, the light emitting diodes 270R, 270G, and 270B may be horizontal light emitting diodes in which the second electrodes 275R, 275G, and 275B and the first electrodes 271R, 271G, and 271B are disposed in the horizontal direction.

The second semiconductor layers 274R, 274G, and 274B may be formed by injecting an n-type impurity into gallium nitride (GaN) having excellent crystallinity. The second semiconductor layers 274R, 274G, and 274B may also be disposed on a separate base substrate which is formed of a material which may emit light.

The emission layers 273R, 273G, and 273B may be disposed on the second semiconductor layers 274R, 274G, and 274B. The emission layers 273R, 273G, and 273B are light emitting layers which emit light in the light emitting diode 270R, 270G, and 270B and may be formed of a nitride semiconductor, for example, indium gallium nitride (InGaN). The first semiconductor layers 272R, 272G, and 272B may be disposed on the emission layers 273R, 273G, and 273B. The first semiconductor layers 272R, 272G, and 272B may be formed by injecting a p-type impurity into gallium nitride (GaN).

As described above, the light emitting diodes 270R, 270G, and 270B according to another exemplary embodiment of the present disclosure may be manufactured by sequentially laminating the second semiconductor layers 274R, 274G, and 274B, the emission layers 273R, 273G, and 273B, and the first semiconductor layers 272R, 272G, and 272B, etching a predetermined part, and then forming the second electrodes 275R, 275G, and 275B and the first electrodes 271R, 271G, and 271B. At this time, the predetermined part is a space for spacing the second electrodes 275R, 275G, and 275B apart from the first electrodes 271R, 271G, and 271B so that a predetermined part may be etched to expose a part of the second semiconductor layers 274R, 274G, and 274B. In other words, surfaces of the light emitting diodes 270R, 270G, and 270B on which the second electrodes 275R, 275G, and 275B and the first electrodes 271R, 271G, and 271B are formed are not flat surfaces, but may have different height levels.

As described above, in the etched area, the second electrodes 275R, 275G, and 275B are disposed and the second electrodes 275R, 275G, and 275B may be formed of a conductive material. Further, in an area which is not etched, the first electrodes 271R, 271G, and 271B are disposed and the first electrodes 271R, 271G, and 271B may also be formed of a conductive material. For example, the second electrodes 275R, 275G, and 275B are disposed on the second semiconductor layers 274R, 274G, and 274B which are exposed by the etching process and the first electrodes 271R, 271G, and 271B may be disposed on the first semiconductor layers 272R, 272G, and 272B. The first electrodes 271R, 271G, and 271B may be formed of the same material as the second electrodes 275R, 275G, and 275B.

An adhesive layer AD is disposed on top surfaces of the first connection pad CNT1 and the second connection pad CNT2 and between the first connection pad CNT1 and the second connection pad CNT2. Therefore, the light emitting diodes 270R, 270G, and 270B may be bonded onto the first connection pad CNT1 and the second connection pad CNT2. At this time, the second electrodes 275R, 275G, and 275B are disposed on the first connection pad CNT1 and the first electrodes 271R, 271G, and 271B may be disposed on the second connection pad CNT2.

The adhesive layer AD may be a conductive adhesive layer in which conductive balls are dispersed in an insulating base member. Therefore, when heat or a pressure is applied to the adhesive layer AD, the conductive balls are electrically connected in a portion applied with the heat or pressure to have a conductive property and an area which is not pressurized may have an insulation property. For example, the second electrodes 275R, 275G, and 275B are electrically connected to the first connection pad CNT1 by means of the adhesive layer AD and the first electrodes 271R, 271G, and 271B may be electrically connected to the second connection pad CNT2 by means of the adhesive layer AD. After applying the adhesive layer AD onto the first connection pad CNT1 and the second connection pad CNT2 by the inkjet manner, the light emitting diodes 270R, 270G, and 270B are transferred onto the adhesive layer AD, pressurized, and then heated to electrically connect the second connection pad CNT2 and the first electrodes 271R, 271G, and 271B and the first connection pad CNT1 and the second electrodes 275R, 275G, and 275B. However, the remaining part of the adhesive layer AD excluding a part of the adhesive layer AD disposed between the second electrodes 275R, 275G, and 275B and the first connection pad CNT1 and a part of the adhesive layer AD disposed between the first electrodes 271R, 271G, and 271B and the second connection pad CNT2 may have an insulating property. In the meantime, the adhesive layer AD may be divided to be also disposed on the first connection pad CNT1 and the second connection pad CNT2, respectively.

The first connection pad CNT1 may be applied with the low potential voltage for driving the light emitting diodes 270R, 270G, and 270B from the power supply.

The second connection pad CNT2 is electrically connected to a drain electrode of a driving transistor to be applied with a driving voltage for driving the light emitting diodes 270R, 270G, and 270B from the driving transistor.

Therefore, when the display device 200 is turned on, different voltage levels which are applied to the first connection pad CNT1 and the second connection pad CNT2 are transmitted to the second electrodes 275R, 275G, and 275B and the first electrodes 271R, 271G, and 271B. By doing this, the light emitting diodes 270R, 270G, and 270B may emit light.

In the meantime, a quantum dot layer QD may be disposed in the light emitting diodes 270R, 270G, and 270B.

As illustrated in FIG. 6, quantum dot layers RQD and GQD may be disposed between the first electrodes 271R and 271G and the second electrodes 275R and 275G and the first semiconductor layers 272R and 272G and the second semiconductor layers 274R and 274G.

To be more specific, the quantum dot layers RQD and GQD may be disposed on top surfaces of the first electrodes 271R and 271G and the second electrodes 275R and 275G and bottom surfaces of the first semiconductor layers 272R and 272G and the second semiconductor layers 274R and 274G.

Quantum dots with various sizes may be disposed in the quantum dot layers RQD and GQD. A wavelength of light emitted from the quantum dot layers RQD and GQD may vary depending on the size of the quantum dot. For example, as the size of the quantum dot is increased, light with longer wavelength is emitted and as the size of the quantum dot is reduced, light with shorter wavelength is emitted.

The passivation layer PAS covers outsides of the light emitting diodes 270R, 270G, and 270B to protect. Specifically, the passivation layer PAS may be disposed so as to cover side surfaces of the first semiconductor layers 272R, 272G, and 272B, the emission layers 273R, 273G, and 273B, and the second semiconductor layers 274R, 274G, and 274B of the light emitting diode, and side surfaces of the quantum dot layers RQD and GQD.

Therefore, outer surfaces of the quantum dot layers RQD and GQD may be covered by the first electrodes 271R and 271G, the first semiconductor layers 272R and 272G, the emission layers 273R and 273G, the second semiconductor layers 274R and 274G, the second electrodes 275R and 275G, and the passivation layer PAS.

The passivation layer PAS may be configured by a single layer or a double layer formed of at least one of silicon nitride (SiNx), silicon oxide (SiOx), and silicon oxynitride (SiON).

Quantum dots disposed in the quantum dot layers RQD and GQD are very vulnerable to external moisture or oxygen due to the nature of the material. Accordingly, the encapsulation over the quantum dot layers RQD and GQD is essential to consistently maintain a same level of efficiency.

The display device 200 according to another exemplary embodiment of the present disclosure is advantageous in that the quantum dot layers RQD and GQD are disposed in the light emitting diodes 270R and 270G so that the quantum dot layers RQD and GQD may be encapsulated without a separate encapsulation layer.

Therefore, the reliability of the quantum dot layers RQD and GOD of the display device 200 according to another exemplary embodiment of the present disclosure is improved thereby further enhancing the reliability for implementing the image of the display device. In addition, as noted previously, because a separate encapsulation layer is not required, the thickness of the display device can be reduced. Moreover, because the manufacturing process for adding the separate encapsulation layer is not required, the overall cost for manufacturing the display device can be reduced.

In one embodiment, the display device includes a passivation layer adjacent to the quantum dot layer, the passivation layer having a second inclined surface and the second inclined surface is adjacent to and in contact with the quantum dot layer. Further, the second inclined surface of the passivation layer and the first inclined surface of the inclined portion of the first electrode have a different inclination angle from each other.

In the meantime, referring to FIG. 6, the plurality of light emitting diodes may include a first light emitting diode 270R configured to emit light with a first wavelength, a second light emitting diode 270G configured to emit light with a second wavelength, and a third light emitting diode 270B configured to emit light with a third wavelength.

The first wavelength is longer than the second wavelength and the second wavelength may be longer than the third wavelength. For example, the first wavelength corresponds to a wavelength of red, the second wavelength corresponds to a wavelength of green, and the third wavelength may correspond to a wavelength of blue.

The first light emitting diode 270R includes a first quantum dot layer RQD, the second light emitting diode 270G includes a second quantum dot layer GQD, and the third light emitting diode 270B includes a transmission layer TR.

The placement relationship of the first quantum dot layer RQD, the second quantum dot layer GQD, and the transmission layer TR may be the same from each other. Therefore, thicknesses of the first quantum dot layer RQD, the second quantum dot layer GQD, and the transmission layer TR may be the same.

The first quantum dot layer RQD converts light with a third wavelength into a first wavelength and the second quantum dot layer GQD may convert the light with the third wavelength into a second wavelength.

Therefore, the emission layer 273R of the first light emitting diode 270R generates light with the third wavelength and the first quantum dot layer RQD of the first light emitting diode 270R converts light with the third wavelength into light with the first wavelength. As a result, the first light emitting diode 270R may emit light with the first wavelength.

The emission layer 273G of the second light emitting diode 270G generates light with the third wavelength and the second quantum dot layer GOD of the second light emitting diode 270G converts light with the third wavelength into light with the second wavelength. As a result, the second light emitting diode 270G may emit light with the second wavelength.

The emission layer 273B of the third light emitting diode 270B generates light with the third wavelength and the third light emitting diode 270B may emit light with the third wavelength by means of the transmission layer TR.

As described above, the first light emitting diode 270R and the second light emitting diode 270G may emit light by means of color conversion through the first quantum dot layer RQD and the second quantum dot layer GQD.

The above-described passivation layer PAS has a low refractive characteristic in a long wavelength as compared with a short wavelength. Therefore, when a red shift occurs by the color conversion by means of the first quantum dot layer RQD and the second quantum dot layer GQD, an angle at which total reflection occurs on an interface of the passivation layer PAS is increased. Therefore, the total reflection efficiently occurs on the passivation layer PAS of the display device 200 according to another exemplary embodiment of the present disclosure so that the light loss may be reduced or minimized.

Therefore, the luminous efficiency of the display device according to another exemplary embodiment of the present disclosure may be increased.

Further, in the display device according to another exemplary embodiment of the present disclosure, a distributed Bragg reflector (DBR) may be disposed on the first light emitting diode 270R and the second light emitting diode 270G.

The distributed Bragg reflector DBR reflects light with the third wavelength and may transmit light with the first wavelength and the second wavelength.

That is, in each of the first light emitting diode 270R and the second light emitting diode 270G, the color conversion is not performed by the first quantum dot layer RQD and the second quantum dot layer GQD, but the light with the third wavelength may be upwardly emitted.

Therefore, the distributed Bragg reflector DBR downwardly reflects the light with the third wavelength which is emitted from the first light emitting diode 270R and the second light emitting diode 270G to reuse the light.

Therefore, the light with the third wavelength which is reflected to the first quantum dot layer RQD and the second quantum dot layer GQD by the distributed Bragg reflector DBR may be converted into light with the first wavelength or light with the second wavelength.

Therefore, the luminous efficiency of the light with the first wavelength emitted from the first light emitting diode 270R of the display device 200 according to another exemplary embodiment of the present disclosure and the luminous efficiency of the light with the second wavelength emitted from the second light emitting diode 270G may be increased.

Consequently, the color purity of the display device according to another exemplary embodiment of the present disclosure may be improved.

The exemplary embodiments of the present disclosure can also be described as follows:

According to an aspect of the present disclosure, a display device includes a stretchable lower substrate; a plurality of lower plate patterns disposed on the lower substrate; and a plurality of pixels disposed on the plurality of lower plate patterns, and each of the plurality of pixels includes a plurality of light emitting diodes and a quantum dot layer is disposed in at least one of the plurality of light emitting diodes. By doing this, a luminous efficiency and a reliability of the display device may be improved.

Each of the light emitting diodes may include a first electrode, a first semiconductor layer, an emission layer, a second semiconductor layer, and a second electrode and Each of the light emitting diodes may be a vertical light emitting diodes in which the first electrode and the second electrode are disposed in a vertical direction and the quantum dot layer may be disposed between the first electrode and the first semiconductor layer.

Each of the light emitting diodes may further include a passivation layer which covers side surfaces of the first semiconductor layer, the emission layer, the second semiconductor layer, and the quantum dot layer.

An outer surface of the quantum dot layer may be covered by the first electrode, the first semiconductor layer, and the passivation layer.

A display device may further comprise an upper substrate which is opposite to the lower substrate and is stretchable; an upper plate pattern disposed below the upper substrate; and a plurality of conductive patterns which is disposed below the upper plate pattern and is electrically connected to the second electrode.

The display device may further comprise a plurality of upper line patterns disposed below the upper substrate; and a plurality of upper connection lines which is disposed below the plurality of upper line patterns and connects the plurality of conductive patterns.

Each of the light emitting diodes may include a first electrode, a first semiconductor layer, an emission layer, a second semiconductor layer, and a second electrode and each of the light emitting diodes may be a horizontal light emitting diodes in which the first electrode and the second electrode are disposed in a horizontal direction and the quantum dot layer is disposed between upper surfaces of the first electrode and the second electrode and lower surfaces of the first semiconductor layer and the second semiconductor layer.

Each of the light emitting diodes may further include a passivation layer which covers side surfaces of the first semiconductor layer, the emission layer, the second semiconductor layer, and the quantum dot layer.

An outer surface of the quantum dot layer may be covered by the first electrode, the first semiconductor layer, the emission layer, the second semiconductor layer, the second electrode, and the passivation layer.

The plurality of light emitting diodes may include a first light emitting diode configured to emit light with a first wavelength; a second light emitting diode configured to emit light with a second wavelength; and a third light emitting diode configured to emit light with a third wavelength; and the first wavelength is longer than the second wavelength and the second wavelength is longer than the third wavelength.

The display device may further comprise a distributed Bragg reflector which is disposed on the first light emitting diode and the second light emitting diode to reflect light with the third wavelength and transmit light with the first wavelength and the second wavelength.

The first light emitting diode may include a first quantum dot layer which converts light with the third wavelength into the first wavelength and the second light emitting diode includes a second quantum dot layer which converts light with the third wavelength into the second wavelength.

The third light emitting diode may include a transmission layer with the same thickness with the first quantum dot layer and the second quantum dot layer.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. All the technical concepts in the equivalent scope of the present disclosure should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:

a lower substrate;

a plurality of lower plate patterns disposed on the lower substrate, the plurality of lower plate patterns being spaced apart from one another and arranged as discrete islands on the lower substrate;

a plurality of pixels disposed on the plurality of lower plate patterns, each of the plurality of pixels including a plurality of light emitting diodes; and a quantum dot layer disposed in at least one of the plurality of light emitting diodes, wherein each of the light emitting diodes of the plurality of light emitting diodes includes a first electrode, a first semiconductor layer, an emission layer, a second semiconductor layer, and a second electrode, and wherein the quantum dot layer is disposed between the first electrode and the first semiconductor layer.

2. The display device according to claim 1, wherein each of the light emitting diodes is a vertical light emitting diodes in which the first electrode and the second electrode are disposed in a vertical direction.

3. The display device according to claim 2, wherein each of the light emitting diodes further includes a passivation layer which covers side surfaces of the first semiconductor layer, the emission layer, the second semiconductor layer, and the quantum dot layer.

4. The display device according to claim 3, wherein an outer surface of the quantum dot layer is covered by the first electrode, the first semiconductor layer, and the passivation layer.

5. The display device according to claim 2, further comprising:

an upper substrate which is opposite to the lower substrate and is stretchable;

an upper plate pattern disposed below the upper substrate; and a plurality of conductive patterns which is disposed below the upper plate pattern and is electrically connected to the second electrode.

6. The display device according to claim 5, further comprising:

a plurality of upper line patterns disposed below the upper substrate; and a plurality of upper connection lines which is disposed below the plurality of upper line patterns and electrically connects the plurality of conductive patterns.

7. The display device according to claim 1, wherein each of the light emitting diodes is a horizontal light emitting diodes in which the first electrode and the second electrode are disposed in a horizontal direction and the quantum dot layer is disposed between upper surfaces of the first electrode and the second electrode and lower surfaces of the first semiconductor layer and the second semiconductor layer.

8. The display device according to claim 7, wherein each of the light emitting diodes further includes a passivation layer which covers side surfaces of the first semiconductor layer, the emission layer, the second semiconductor layer, and the quantum dot layer.

9. The display device according to claim 8, wherein an outer surface of the quantum dot layer is covered by the first electrode, the first semiconductor layer, the emission layer, the second semiconductor layer, the second electrode, and the passivation layer.

10. The display device according to claim 1, wherein the plurality of light emitting diodes includes:

a first light emitting diode configured to emit light with a first wavelength;

a second light emitting diode configured to emit light with a second wavelength;

a third light emitting diode configured to emit light with a third wavelength; and wherein the first wavelength is longer than the second wavelength and the second wavelength is longer than the third wavelength.

11. The display device according to claim 10, further comprising:

a distributed Bragg reflector which is disposed on the first light emitting diode and the second light emitting diode to reflect light with the third wavelength and transmit light with the first wavelength and the second wavelength.

12. The display device according to claim 10, wherein the first light emitting diode includes a first quantum dot layer which converts light with the third wavelength into the first wavelength and the second light emitting diode includes a second quantum dot layer which converts light with the third wavelength into the second wavelength.

13. The display device according to claim 12, wherein the third light emitting diode includes a transmission layer with the same thickness with the first quantum dot layer and the second quantum dot layer.

14. A display device, comprising:

a substrate;

a plurality of plate patterns disposed on the substrate, the plurality of plate patterns being spaced apart from one another and arranged as discrete islands on the substrate;

a plurality of pixels on the plurality of plate patterns, each pixel of the plurality of pixels including a light emitting diode, the light emitting diode including:

a first electrode;

a quantum dot layer adjacent to the first electrode;

a first semiconductor layer on the quantum dot layer;

an emission layer on the first semiconductor layer; and a second electrode on the emission layer.

15. The display device of claim 14, wherein the first electrode includes a first portion, an inclined portion, and a second portion, wherein the inclined portion is between the first portion and the second portion, wherein the inclined portion has a first inclined surface and the first portion has a first surface, and wherein the quantum dot layer is adjacent to and in contact with the first surface of the first portion and the first inclined surface of the inclined portion.

16. The display device of claim 15, wherein the second portion has a second surface and the quantum dot layer includes a third surface, wherein the third surface of the quantum dot layer is spaced apart from the second surface of the second portion, wherein the third surface of the quantum dot layer is closer to the substrate compared to the second surface of the second portion of the first electrode.

17. The display device of claim 16, wherein the third surface of the quantum dot layer is adjacent to and in contact with the first semiconductor layer.

18. The display device of claim 14, comprising:

a second light emitting diode adjacent to the light emitting diode; and a third light emitting diode adjacent to the second light emitting diode, wherein the light emitting diode includes a first quantum dot layer configured to convert light having a third wavelength into a first wavelength, wherein the second light emitting diode includes a second quantum dot layer configured to convert light having the third wavelength into a second wavelength, and wherein the first quantum dot layer is the quantum dot layer.

19. The display device of claim 18, comprising:

a reflector on the light emitting diode and the second light emitting diode, wherein the reflector overlaps the light emitting diode and the second light emitting diode from a plan view.

20. The display device of claim 19, wherein the reflector is spaced apart from the third light emitting diode, wherein the reflector does not overlap with the third light emitting diode from a plan view.

* * * * *